United States Patent
Naka et al.

(10) Patent No.: US 8,213,247 B2
(45) Date of Patent: Jul. 3, 2012

(54) MEMORY DEVICE WITH TEST MECHANISM

(75) Inventors: Tomomi Naka, Kama (JP); Hajime Sakata, Fukuoka (JP)

(73) Assignee: NSCore Inc., Fukuoka (JP)

( * ) Notice: Subject to any disclaimer, the term of this patent is extended or adjusted under 35 U.S.C. 154(b) by 333 days.

(21) Appl. No.: 12/618,827

(22) Filed: Nov. 16, 2009

(65) Prior Publication Data

US 2011/0116332 A1    May 19, 2011

(51) Int. Cl.
*G11C 29/00*    (2006.01)

(52) U.S. Cl. ............. 365/201; 365/189.07; 365/210.1

(58) Field of Classification Search ........... 365/201, 365/189.07, 210.1
See application file for complete search history.

(56) References Cited

U.S. PATENT DOCUMENTS

| | | |
|---|---|---|
| 3,636,530 A | 1/1972 | Mark et al. |
| 4,419,744 A | 12/1983 | Rutter |
| 5,956,269 A | 9/1999 | Ouyang et al. |
| 6,038,168 A | 3/2000 | Allen et al. |
| 6,064,590 A | 5/2000 | Han et al. |
| 6,740,927 B1 | 5/2004 | Jeng |
| 6,906,953 B2 | 6/2005 | Forbes |
| 6,906,962 B2 | 6/2005 | Layman et al. |
| 6,909,635 B2 | 6/2005 | Forbes et al. |
| 7,227,234 B2 | 6/2007 | Roizen et al. |
| 7,414,903 B2* | 8/2008 | Noda ............................ 365/201 |
| 7,894,264 B2* | 2/2011 | Ha et al. ................... 365/185.17 |
| 2004/0232477 A1 | 11/2004 | Iwata et al. |
| 2004/0252554 A1 | 12/2004 | Fournel et al. |

FOREIGN PATENT DOCUMENTS

| | | |
|---|---|---|
| JP | 06-076582 | 3/1994 |
| JP | 06-231587 | 8/1994 |
| JP | 2001-156188 | 6/2001 |
| JP | 2002-237540 | 8/2002 |
| WO | WO2004/057621 | 7/2004 |
| WO | WO2006/093629 | 9/2006 |

* cited by examiner

*Primary Examiner* — Huan Hoang
(74) *Attorney, Agent, or Firm* — IPUSA, PLLC

(57) ABSTRACT

A semiconductor memory device includes a plurality of memory cell transistors arranged in a matrix and each configured to store data, and a test circuit configured to output to outside the semiconductor memory device an output signal indicative of an amount of test current flowing through a selected one of the plurality of memory cell transistors, wherein the test circuit includes a plurality of reference cell transistors employed to successively produce varying amounts of currents, a comparison circuit configured to successively compare the amount of test current with each of the varying amounts of currents, and a code generating circuit configured to generate a code indicative of a result of the successive comparisons performed by the comparison circuit, wherein the code is output as the output signal.

3 Claims, 44 Drawing Sheets

FIG.11

|  | DOUT | CURRENT AMOUNT |
|---|---|---|
| 1 | 0000 | $\leq$ 5uA |
| 2 | 0001 | 5 TO 10uA |
| 3 | 0010 | 10 TO 15uA |
| 4 | 0011 | 15 TO 20uA |
| 5 | 0100 | 20 TO 25uA |
| 6 | 0101 | 25 TO 30uA |
| 7 | 0110 | 30 TO 35uA |
| 8 | 0111 | 35 TO 40uA |
| 9 | 1000 | 40 TO 45uA |
| 10 | 1001 | 45 TO 50uA |
| 11 | 1010 | 50 TO 55uA |
| 12 | 1011 | 55 TO 60uA |
| 13 | 1100 | 60 TO 65uA |
| 14 | 1101 | 65 TO 70uA |
| 15 | 1110 | 70 TO 75uA |
| 16 | 1111 | $\geq$ 75uA |

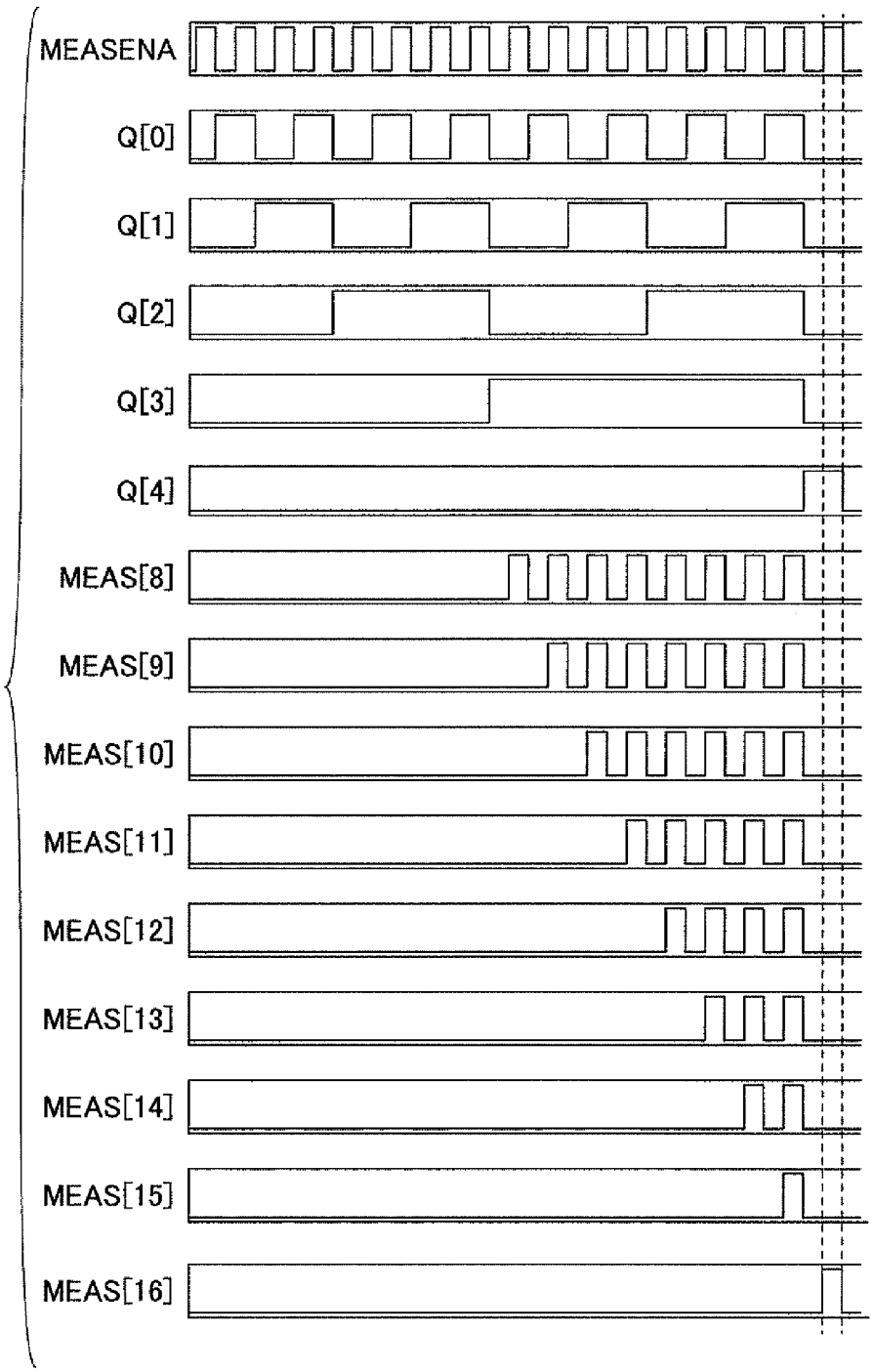

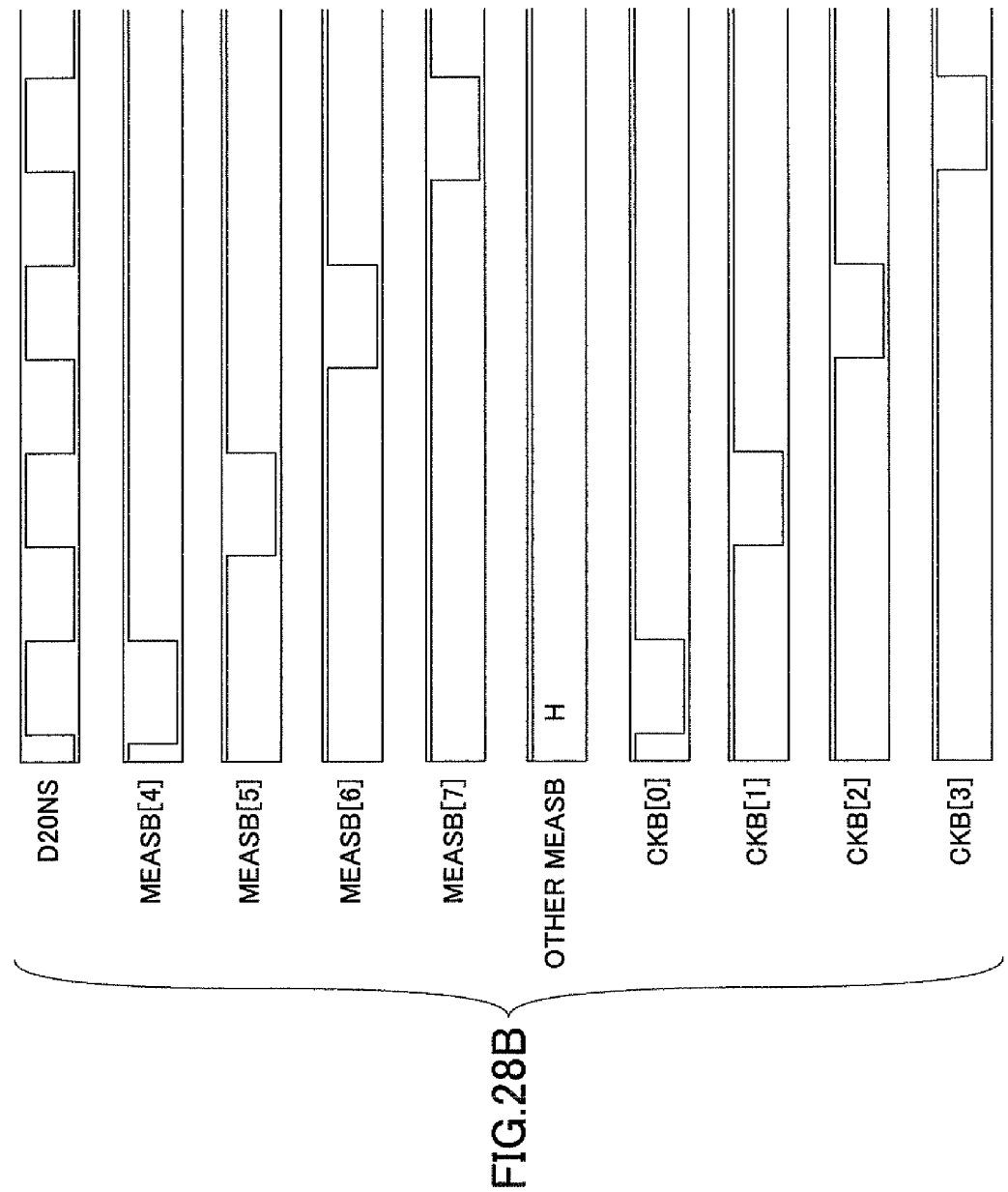

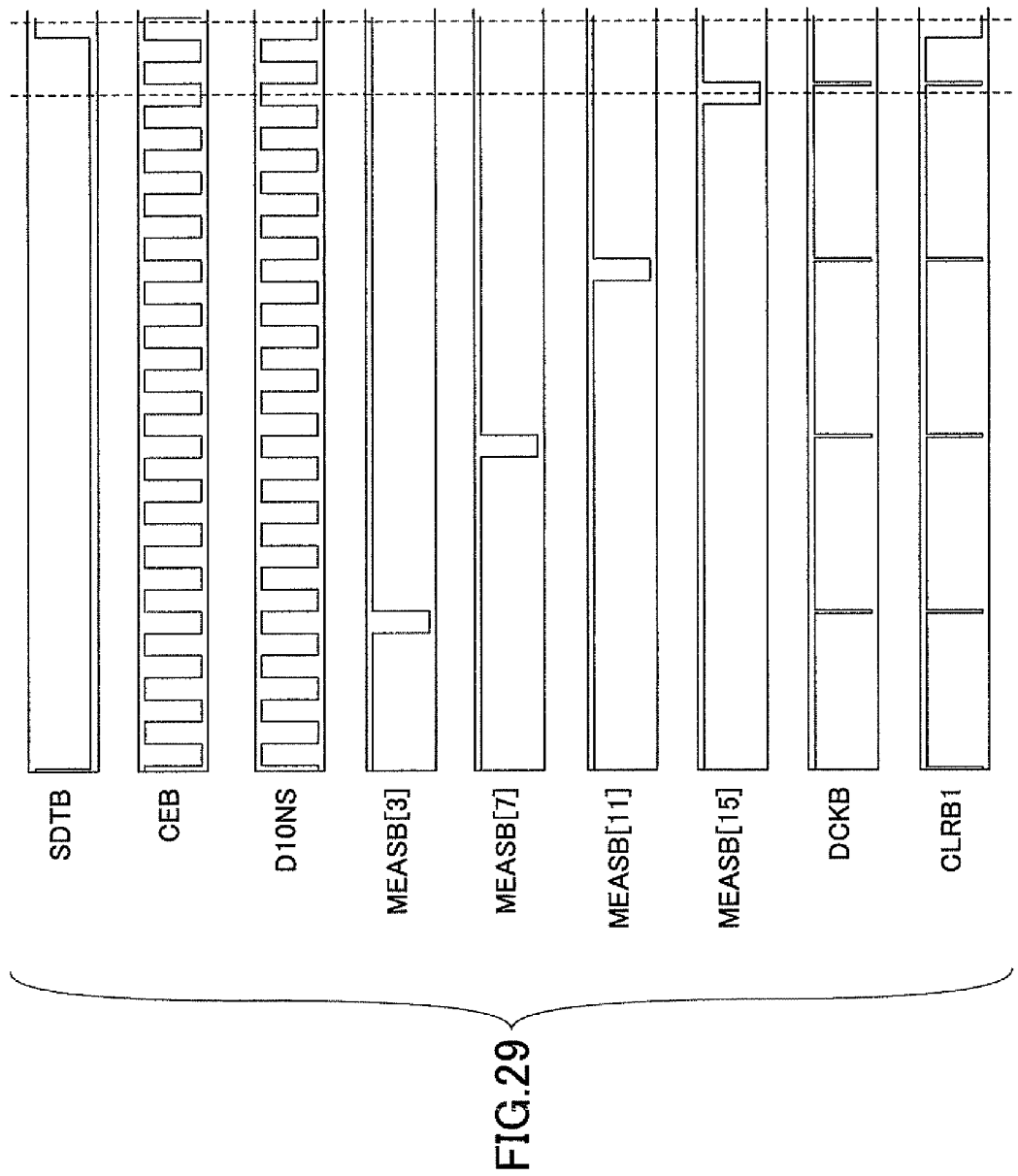

FIG.32

| | TRQ[3:0] | | | | D[3:0] |
|---|---|---|---|---|---|
| | 0 | 1 | 2 | 3 | |
| FIRST SECTION (MEASB[3]=L) | 1 | 1 | 1 | 1 | 0000 |
| | 0 | 1 | 1 | 1 | 0001 |
| | 0 | 0 | 1 | 1 | 0010 |
| | 0 | 0 | 0 | 1 | 0011 |
| | 0 | 0 | 0 | 0 | 0100 |
| SECOND SECTION (MEASB[7]=L) | 1 | 1 | 1 | 1 | 0100 |
| | 0 | 1 | 1 | 1 | 0101 |
| | 0 | 0 | 1 | 1 | 0110 |
| | 0 | 0 | 0 | 1 | 0111 |
| | 0 | 0 | 0 | 0 | 1000 |
| THIRD SECTION (MEASB[11]=L) | 1 | 1 | 1 | 1 | 1000 |
| | 0 | 1 | 1 | 1 | 1001 |
| | 0 | 0 | 1 | 1 | 1010 |
| | 0 | 0 | 0 | 1 | 1011 |
| | 0 | 0 | 0 | 0 | 1100 |
| FOURTH SECTION (MEASB[15]=L) | 1 | 1 | 1 | 1 | 1100 |
| | 0 | 1 | 1 | 1 | 1101 |
| | 0 | 0 | 1 | 1 | 1110 |
| | 0 | 0 | 0 | 1 | 1111 |

MEMORY DEVICE WITH TEST MECHANISM

BACKGROUND OF THE INVENTION

1. Field of the Invention

The disclosures herein generally relate to a memory circuit, and particularly relate to a memory circuit having a test circuit to check an amount of current flowing through a cell transistor.

2. Description of the Related Art

Conventionally, a nonvolatile memory cell requires a special structure such as a floating gate or a special material such as a ferroelectric material or ferromagnetic material for the purpose of achieving nonvolatile data retention. There is a new type of nonvolatile semiconductor memory device called PermSRAM, which uses a MIS (metal-insulating film-semiconductor) transistor as a nonvolatile memory cell (i.e., the basic unit of data storage). The MIS transistor used as a nonvolatile memory cell in PermSRAM has the same structure as ordinary MIS transistors used for conventional transistor functions (e.g., switching function), and do not require a special structure or a special material as described above. The absence of such a special structure and special material offers an advantage in cost reduction. PermSRAM was initially disclosed in PCT/JP2003/016143, which was filed on Dec. 17, 2003, the entire contents of which are hereby incorporated by reference.

The MIS transistor used as a nonvolatile memory cell in PermSRAM is configured to experience an irreversible hot-carrier effect on purpose for storage of one-bit data. Here, the irreversible hot-carrier effect refers to the injection of carriers into the oxide film (insulating film) and/or sidewalls, which causes a change in the transistor's threshold voltage. Whether the threshold voltage has been changed due to a hot-carrier effect represents one-bit data "0" or "1". Such a change in the threshold voltage may be detected by sensing a difference in ON current between the nonvolatile-memory-cell MIS transistor and a reference MIS transistor by using a sensing circuit such as a latch circuit.

When a nonvolatile memory device having nonvolatile memory cells as described above is manufactured, there is a need to conduct a test to ensure that the memory cells perform properly as designed. Testing, however, cannot be performed by use of a conventional test technique, which checks memory cells by writing data to and reading data from these cells. This is because the operation of the above-noted nonvolatile memory cell is founded on an irreversible change of the transistor characteristics. If a test that creates such an irreversible change is actually performed, the memory circuit may no longer be usable.

A test circuit may be provided to compare an amount of current flowing through a nonvolatile memory cell with an amount of current flowing through a test-purpose reference cell. Such a test circuit can determine whether the tested cell transistor can be sufficiently conductive to serve as a memory cell. Occurrence of an excessive amount of current flowing through a cell transistor, however, cannot be detected by this type of test circuit. A cell transistor that allows an excessive amount of current flow is not suitable as a memory cell because an excessively strong hot-carrier effect may be required to sufficiently change an ON current for the purpose of data storage. There may even be a case in which data cannot be properly stored in the cell transistor.

Accordingly, it may be desirable to provide a memory device that can test a cell transistor to check the amount of current flowing through the cell transistor.

SUMMARY OF THE INVENTION

It is a general object of the present invention to provide a semiconductor memory device. According to at least one embodiment of the present invention, a semiconductor memory device includes a plurality of memory cell transistors arranged in a matrix and each configured to store data, and a test circuit configured to output to outside the semiconductor memory device an output signal indicative of an amount of test current flowing through a selected one of the plurality of memory cell transistors, wherein the test circuit includes a plurality of reference cell transistors employed to successively produce varying amounts of currents, a comparison circuit configured to successively compare the amount of test current with each of the varying amounts of currents, and a code generating circuit configured to generate a code indicative of a result of the successive comparisons performed by the comparison circuit, wherein the code is output as the output signal.

BRIEF DESCRIPTION OF THE DRAWINGS

Other objects and further features of the present invention will be apparent from the following detailed description when read in conjunction with the accompanying drawings, in which:

FIG. 11 is a table illustrating an example of the relationships between four-bit test result data and an amount of current;

FIGS. 17A through 17D are drawings showing signal waveforms that illustrate an example of the operation of the select signal generator depicted in FIG. 16;

FIGS. 28A through 28D are drawings showing signal waveforms that illustrate the operation of the sectioning unit depicted in FIG. 27;

FIG. 29 is a drawing showing signal waveforms that further illustrate the operation of the sectioning unit depicted in FIG. 27;

FIG. 32 is a table showing possible bit patterns;

DESCRIPTION OF THE PREFERRED EMBODIMENTS

In the following, embodiments of the present invention will be described with reference to the accompanying drawings.

Figure 1:
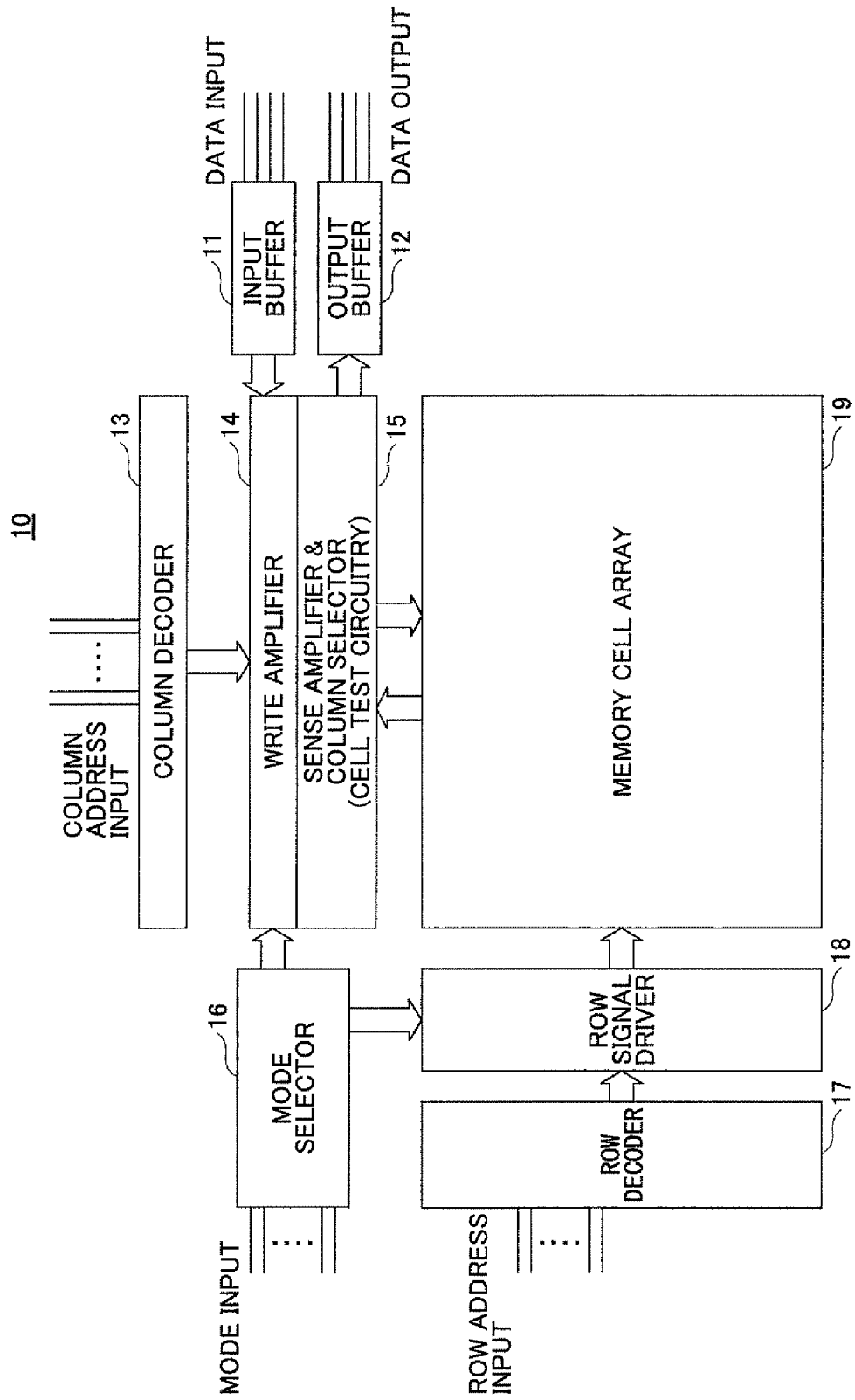
FIG. 1 is a block diagram showing the configuration of a semiconductor memory device in which a test mechanism is incorporated.

FIG. 1 is a block diagram showing the configuration of a semiconductor memory device in which a test mechanism of the present invention is incorporated. A semiconductor memory device 10 shown in FIG. 1 includes an input buffer 11, an output buffer 12, a column decoder 13, a write amplifier 14, a sense amplifier & column selector 15, a mode selector 16, a row decoder 17, a row signal driver 18, and a memory cell array 19. The semiconductor memory device 10 may be a volatile memory device or a nonvolatile memory device. In this embodiment, the semiconductor memory device 10 is a nonvolatile memory device that utilizes MIS transistors as memory cell transistors.

The memory cell array 19 includes a plurality of memory cells arranged in a matrix form, each memory cell having a circuit configuration as will later be described. The memory cells arranged in the same column are connected to the same bit lines, and the memory cells arranged in the same row are connected to the same word line.

The mode selector 16 receives mode input signals from an exterior of the device, and decodes the mode input signal to determine an operation mode (e.g., a write operation mode, a read operation mode, or a test operation mode). Control signals responsive to the determined operation mode are supplied to the write amplifier 14, the sense amplifier & column selector 15, the row signal driver 18, etc., for control of the individual parts of the semiconductor memory device 10.

The column decoder 13 receives a column address input from the exterior of the device, and decodes the column address input to determine a selected column. The decode signals indicative of the selected column are supplied to the write amplifier 14 and the sense amplifier & column selector 15.

The row decoder 17 receives a row address input from the exterior of the device, and decodes the row address input to determine a selected row. The decode signals indicative of the selected row are supplied to the row signal driver 18.

In response to the control signals from the mode selector 16 and the decode signals from the row decoder 17, the row signal driver 18 activates a selected word line among the word lines extending from the row signal driver 18. As a result of the activation of the selected word line, access to each memory cell corresponding to the selected word line is performed through a corresponding bit line (or bit line pair) among a plurality of bit lines.

In response to the control signals from the mode selector 16 and the decode signals from the column decoder 13, the sense amplifier & column selector 15 couples one or more bit lines corresponding to the selected column to a data bus. Through this coupling, data is transferred between the memory cell array 19 and the data bus. The sense amplifier & column selector 15 amplifies the data read from the memory cell array 19 for provision to the output buffer 12. The data is output from the output buffer 12 to the exterior of the device as output data. Input data supplied to the input buffer 11 is provided to the write amplifier 14. The write amplifier 14 amplifies the input data to be written to the memory cell array 19.

Figure 2:
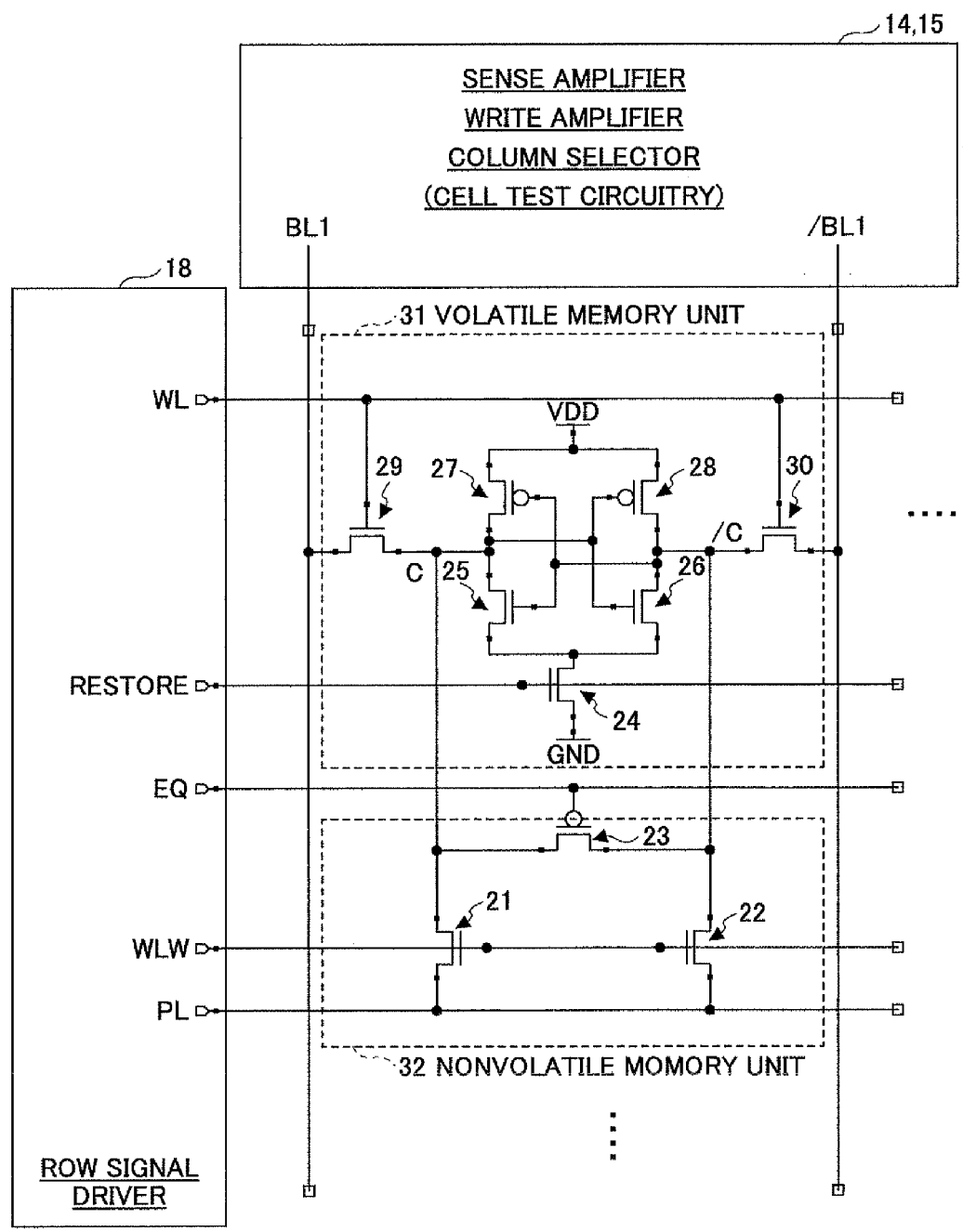
FIG. 2 is an illustrative drawing showing an example of the configuration of a memory cell of the semiconductor memory device shown in FIG. 1.

FIG. 2 is an illustrative drawing showing an example of the configuration of a memory cell of the semiconductor memory device shown in FIG. 1. This example relates to a configuration in which each memory cell is comprised of a latch and a pair of nonvolatile cell transistors.

The memory cell includes NMOS transistors 21 and 22, a PMOS transistor 23, NMOS transistors 24 through 26, PMOS transistors 27 and 28, and NMOS transistors 29 and 30. The NMOS transistors 24 and 26 PMOS transistors 27 and 28 together constitute a volatile memory unit (latch circuit) 31. The NMOS transistors 21 and 22 constitute a nonvolatile memory unit 32. The NMOS transistors 21 and 22 serving as nonvolatile memory cell transistors have the same structure as the other NMOS transistors including the NMOS transistors 24 through 26 used in the volatile memory unit and the NMOS transistors 29 and 30 used as a transfer gate between the memory cell and the bit lines.

As shown in FIG. 2, bit lines BL1 and /BL1 extend from the write amplifier 14 and the sense amplifier & column selector 15, and are coupled to the volatile memory unit 31 via the NMOS transistors 29 and 30 serving as a data transfer unit. A word selecting line WLW extends from the row signal driver 18, and is coupled to the gate nodes of the NMOS transistors 21 and 22 serving as the nonvolatile memory unit 32. A word line WL extends from the row signal driver 18 to be connected to the gates of the NMOS transistors 29 and 30. Further, a restore line RESTORE, plate line (controlled-power line) PL, and equalize line EQ also extend from the row signal driver 18.

It should be noted that the configuration shown in FIG. 2 is identical with respect to each and every one of the memory cells provided in the memory cell array 19. Namely, multiple sets of the lines RESTORE, PL, WLW, EQ, and WL are provided in one-to-one correspondence to the rows of the memory cell array 19. In this configuration, a store operation (storing data from the volatile memory unit 31 to the nonvolatile memory unit 32) and a restore operation (reading data from the nonvolatile memory unit 32 to the volatile memory unit 31) may be performed with respect to the entirety of the memory cell array 19, rather than performed on a row-address-specific basis. Read/write operations of the volatile memory unit 31 with respect to the bit lines BL1 and /BL1 may be performed on a row-address-specific basis.

The store operation of the nonvolatile memory device 10 will now be briefly described. When the mode input from the exterior of the device indicates a store operation, the control lines PL, RESTORE, WLW, EQ, and WL are set to EXTRA-HIGH, HIGH, HIGH, HIGH, and LOW, respectively. EXTRA-HIGH is an extra-high voltage Vpp (e.g., 3.3 V), and HIGH is a power supply voltage Vdd (e.g., 1.8V). The potentials of the node C and the node /C are inverse to each other, and the data stored in the latch circuit (NMOS transistors 25 and 26 and PMOS transistors 27 and 28) determines which one of the nodes C and /C is HIGH. For the sake of convenience of explanation, it is assumed that the node /C is HIGH (Vdd=1.8 V), and the node C is LOW (GND: ground). In this case, only the NMOS transistor 21 experiences a rise in the threshold voltage due to a hot-carrier effect. The NMOS transistor 22 does not experience a change in the threshold voltage. This achieves the storing of the data of the volatile memory unit 31 in the nonvolatile memory unit 32.

During the store operation as described above, the high potential (3.3 V) is never applied to the latch circuit. This is because the NMOS transistors 21 and 22 serve as intervening circuit elements between the plate line PL (Vpp=3.3 V) and the nodes C and /C. Since the word selecting line WLW is set to HIGH, and the nodes C and /C are serving as source nodes, the potentials at the nodes C and /C cannot exceed HIGH minus the threshold voltage. In this configuration, therefore, a hot-carrier effect does not happen in the transistors used in the latch circuit (volatile memory unit 31).

In the following, the restore operation of the nonvolatile memory device 10 will be briefly described. When the mode input from outside the device indicates a restore operation, the control lines PL, RESTORE, WLW, EQ, and WL are set to LOW, LOW→LOW→HIGH, LOW→HIGH→LOW, LOW→HIGH→HIGH, and LOW, respectively. Here, LOW→HIGH→LOW, for example, indicates that the signal level is set to LOW at a first phase, HIGH at a second phase, and LOW at a third phase.

At the first phase, the signal RESTORE is set to LOW, and the signal EQ is set to LOW. As a result, the NMOS transistor 24 in FIG. 2 becomes nonconductive to deactivate the volatile memory unit 31, and the PMOS transistor 23 in FIG. 2 becomes conductive to equalize the nodes C and /C.

At the second phase, the signal EQ is set to HIGH, and the word selecting line WLW is set to HIGH. As a result, the PMOS transistor 23 is turned off to separate the nodes C and /C from each other, and the NMOS transistors 21 and 22 are turned on. Assuming that the store operation as described above has been performed prior to the restore operation, the NMOS transistor 21 has a higher threshold voltage, and thus has a higher ON resistance. Accordingly, the force that pulls down the node C is weaker than the force that pulls down the node /C, resulting in the nodes C and /C changing to HIGH and LOW, respectively.

At the third phase, the signal RESTORE is set to HIGH, and the word selecting line WLW is set to LOW. As a result, the NMOS transistor 24 becomes conductive to activate the volatile memory unit 31, and the NMOS transistors 21 and 22 are turned off. The activated volatile memory unit 31 amplifies a potential difference appearing between the node C and the node /C, thereby sensing (detecting) the data stored in the nonvolatile memory unit 32.

In the configuration described above, a drain node and a source node of the NMOS transistors 21 and 22 used to apply a bias for generating the hot-carrier effect are swapped and used as a source node and a drain node, respectively, at the time of reading the data. With the swapping of the source and drain nodes at the time of data read operation relative to the time of data write operation, a change in the transistor characteristics caused by the hot-carrier effect is efficiently used as a means to store data. It should be noted, however, that the storing and reading (restoring) of data can be performed without such swapping of source and drain nodes, as described in PCT/JP2003/016143, for example. The swapping of drain and source nodes merely serves to utilize asymmetry of a hot-carrier effect. Namely, when the source node and drain node used to apply a bias for generating a hot-carrier effect are swapped and used as a drain node and a source node, respectively, at the time of detecting a drain current, the detected drain current exhibits a larger drop caused by the hot-carrier effect than would be observed when no swapping was performed.

Figure 3:
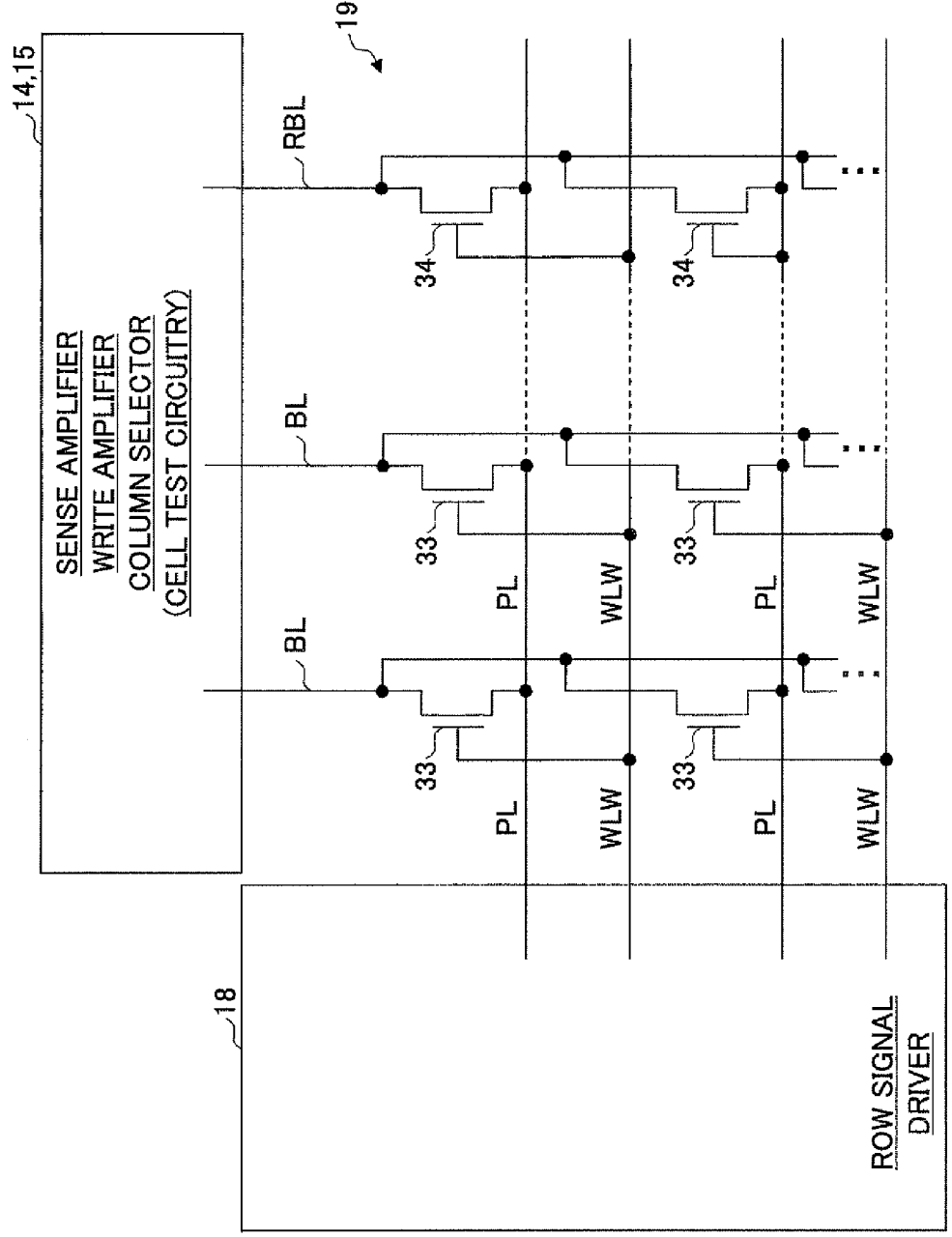
FIG. 3 is an illustrative drawing showing an example of the configuration of a memory cell of the semiconductor memory device shown in FIG. 1.

FIG. 3 is an illustrative drawing showing an example of the configuration of a memory cell of the semiconductor memory device shown in FIG. 1. This example relates to a configuration in which each memory cell is comprised of a nonvolatile cell transistor.

As shown in FIG. 3, bit lines BL extend from the write amplifier 14 and the sense amplifier & column selector 15, and are coupled to memory cells (i.e., NMOS transistors) 33. Further, a reference bit line RBL extends from the write amplifier 14 and the sense amplifier & column selector 15, and is coupled to reference cells (i.e., NMOS transistors) 34 each serving as a constant current source. The NMOS transistor 34 may be designed such that its ON current is smaller than the ON current of the NMOS transistor 33 having experienced no hot-carrier effect, and is larger than the ON current of the NMOS transistor 33 having experienced a hot-carrier effect. Word selecting lines WLW extend from the row signal driver 18 to be coupled to the gates of the NMOS transistors 33 and to the gates of the NMOS transistors 34. Plate lines PL also extend from the row signal driver 18 to be connected to the source/drain of the NMOS transistors 33 and to the source of the NMOS transistors 34.

In the case of a data write operation, a selected bit line BL corresponding to a selected column carries write data supplied from an external source. The row signal driver 18 sets a selected word selecting line WLW to 1.8 V, and sets the remaining word selecting lines WLW to 0 V. Further, the row signal driver 18 sets a selected plate line PL to 3.3 V, and sets the remaining plate lines PL to 0 V. This causes the NMOS transistor 33 on the selected row at the selected column to experience a hot-carrier effect or not to experience a hot-carrier effect, depending on the value of the corresponding data bit carried on the selected bit line BL. Further, the write amplifier 14 and sense amplifier & column selector 15 may be designed such that the reference bit line RBL is placed in a floating state, for example. This ensures that the threshold voltages of the NMOS transistors 34 are not changed by a hot-carrier effect.

In the case of a data read operation, the row signal driver 18 sets a selected word selecting line WLW to 1.8 V, and sets the remaining word selecting line WLW to 0 V. All the plate lines PL are kept at 0 V in the data read operation. A selected bit line BL corresponding to a selected column is coupled to a latch which may be provided in the sense amplifier & column selector 15. The reference bit line RBL is also coupled to this latch. The latch senses the data stored in the NMOS transistor 33 on the selected row at the selected column by comparing a data current flowing through this NMOS transistor 33 with a reference current flowing through the NMOS transistor 34 arranged on the same selected row.

In the following, a test mechanism provided in the semiconductor memory device 10 will be described. A cell test circuitry is provided together with the write amplifier & sense amplifier & column selector 14, 15. In a test operation mode, the cell test circuitry detects a current flowing through the NMOS transistor 21 or 22 in the case of the cell-array configuration shown in FIG. 2, and detects a current flowing through a selected one of the NMOS transistors 33 in the case of the cell-array configuration shown in FIG. 3. It should be noted that, when the NMOS transistor 21 or 22 is to be tested, the word line WL is activated to turn on the NMOS transistors 29 and 30.

The detected current is supposed to flow in proper amount when the tested NMOS transistor 21, 22, or 33 is tuned on and thus conductive. No current is supposed to flow when the tested NMOS transistor 21, 22, or 33 is tuned off and thus nonconductive. The cell test circuitry provided in the semiconductor memory device 10 is configured to detect an amount of current flowing through the tested memory cell transistor. One or more signals indicative of the detected current amount is output to outside the semiconductor memory device 10, thereby informing a user of the test results. With this provision, the amount of current flowing through a cell transistor prior to hot-carrier injection may be tested to determine whether the cell transistor has been properly manufactured. Also, the amount of current flowing through a cell transistor after hot-carrier injection may be tested to determine whether the cell transistor is placed in a properly stored state.

The sense amplifier & column selector 15 inclusive of the cell test circuitry and the row signal driver 18 are controlled by the mode selector 16 to perform the above-noted test operation. A memory cell transistor that is to be tested may be specified by a row address and a column address applied from outside the semiconductor memory device 10. The specified memory cell transistor may be coupled to the cell test circuitry under the control of the sense amplifier & column selector 15 and the row signal driver 18. The test operation described herein may be performed with respect to each of the cell transistors 21 and 22 or 33 of all the memory cells.

Figure 4:
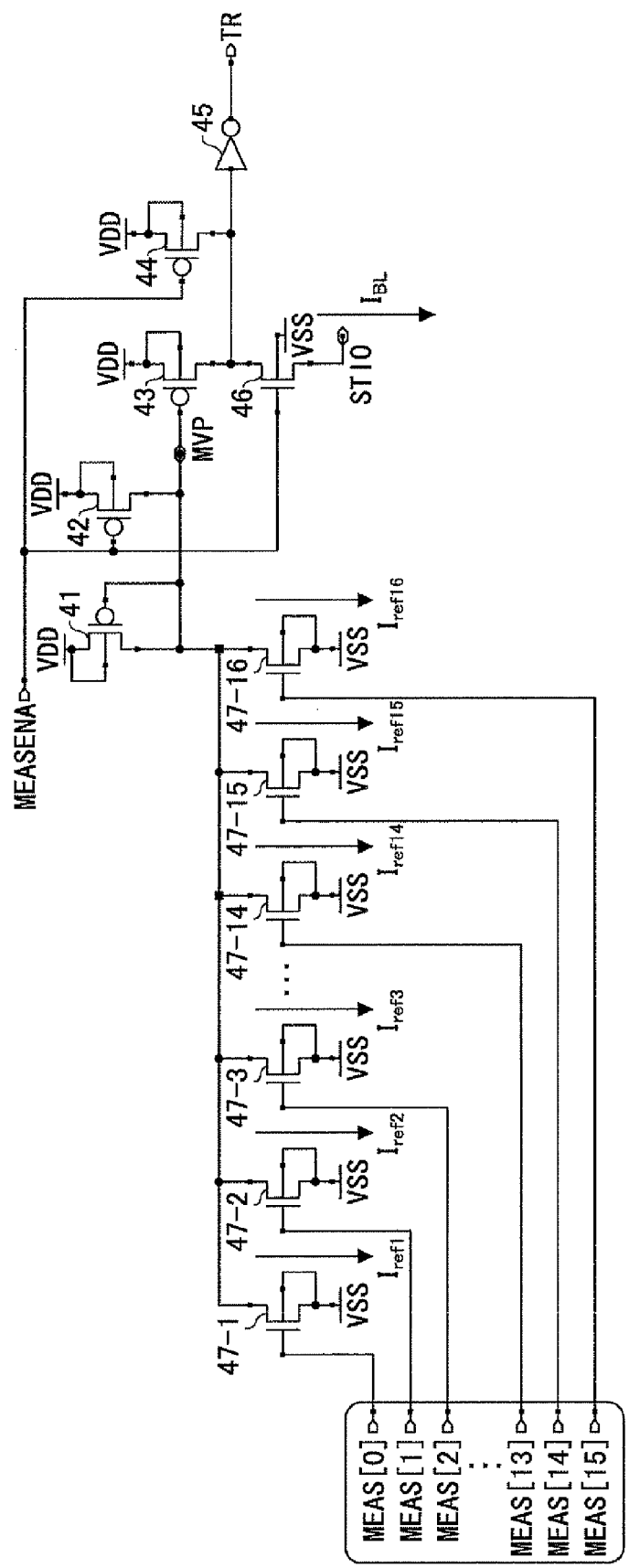
FIG. 4 is a circuit diagram illustrating an example of the configuration of a cell test circuitry.

FIG. 4 is a circuit diagram illustrating an example of the configuration of the cell test circuitry. The cell test circuitry of FIG. 4 includes PMOS transistors 41 through 44, an inverter 45, and NMOS transistors 46 and 47-1 through 47-16. The PMOS transistors 41 and 43 have the same channel width and same channel length, and have the gate nodes thereof coupled to each other, thereby forming a current mirror circuit. A reference current runs through the PMOS transistor 41 and a selected one of the NMOS transistors 47-1 through 47-16. The reference current is one of $I_{ref1}$ through $I_{ref16}$ corresponding to the respective NMOS transistors 47-1 through 47-16. A current $I_{BL}$, which flows through the tested cell transistor, runs through the PMOS transistor 43 and the NMOS transistor 46. The current $I_{BL}$ is supplied to the tested NMOS transistor 21, for example, via the NMOS transistor 29 illustrated in FIG. 2.

The NMOS transistors 47-1 through 47-16 have the gate nodes thereof to which reference select signals MEAS[0] through MEAS[15] are applied, respectively. When one of the reference select signals MEAS[0] through MEAS[15] is set to HIGH, the corresponding one of the NMOS transistors 47-1 through 47-16 are turned on to become conductive. The gate node of the NMOS transistor 46 is coupled to a test enable signal MEASENA, which becomes HIGH whenever one of the reference select signals MEAS[0] through MEAS[15] is set to HIGH.

The NMOS transistors 47-1 through 47-16 are configured such that their respective channel widths vary in an increasing order, for example. The reference currents $I_{ref1}$ through $I_{ref16}$ thus have varying amounts. The larger the value of the subscript, the larger the amount of the reference current $I_{refx}$ (x=1, 2, . . . , or 16), for example. The NMOS transistor 46 is configured to have a sufficiently wide channel width, so that the amount of the current $I_{BL}$ depends only on the characteristics of the tested cell transistor. If the current $I_{BL}$ is larger than the reference current $I_{refx}$ (x=1, 2, . . . , or 16), the input node of the inverter 45 is set to a low potential, resulting in a test result TR (i.e., output of the inverter 45) being HIGH. If the current $I_{BL}$ is smaller than the reference current $I_{refx}$ (x=1, 2, . . . , or 16), the input node of the inverter 45 is set to a high potential, resulting in the test result TR being LOW.

Figure 5:
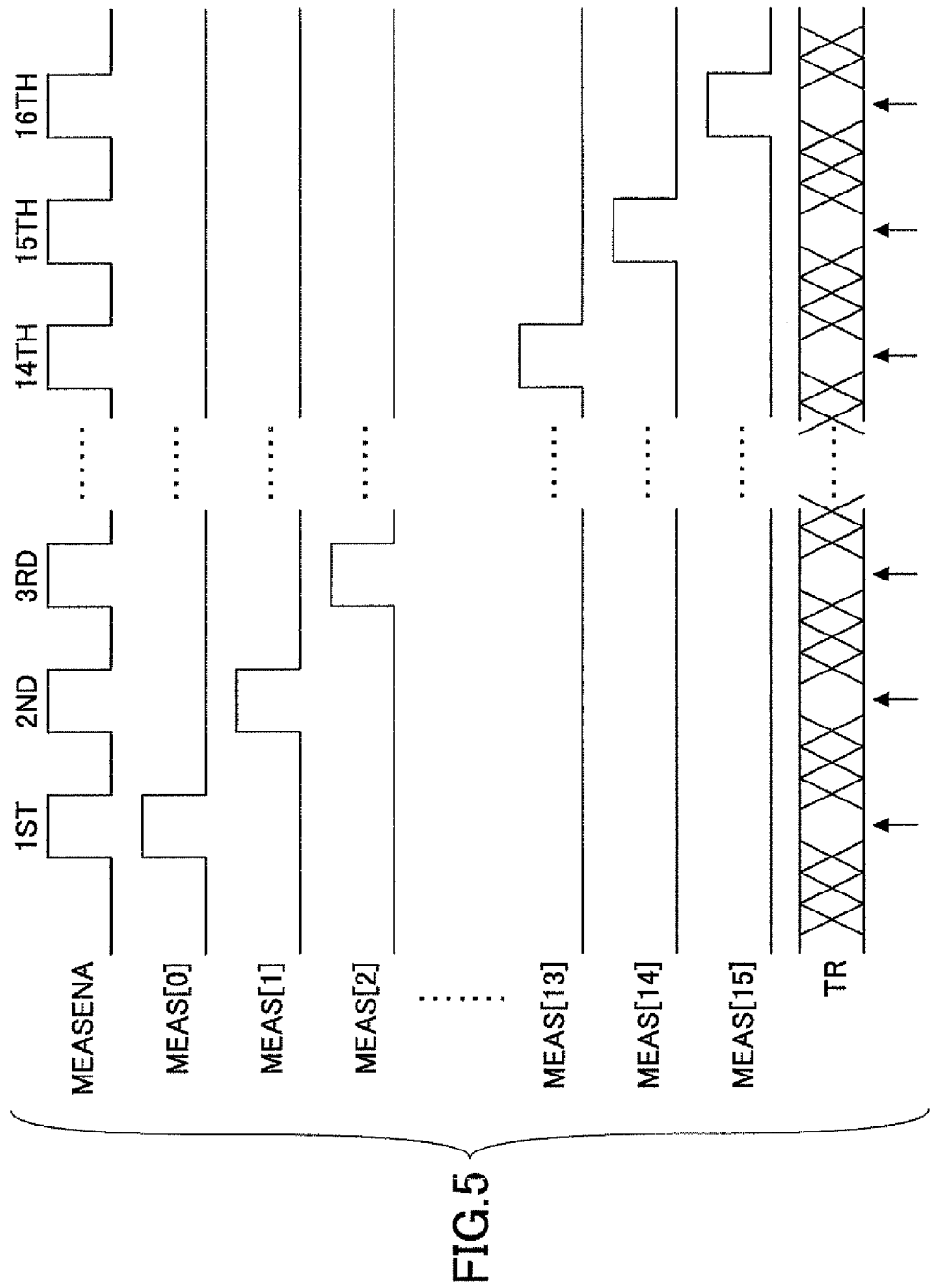
FIG. 5 is a timing chart illustrating the operation of the cell test circuitry shown in FIG. 4.

FIG. 5 is a timing chart illustrating the operation of the cell test circuitry shown in FIG. 4. As illustrated in, FIG. 5, the reference select signals MEAS[0] through MEAS[15] successively becomes HIGH in an ascending order of index numbers in synchronization with the pulses of the test enable signal MEASENA. In synchronization with the test enable signal MEASENA, the test result TR (i.e., output of the inverter 45 illustrated in FIG. 4) is produced as indicated by arrows at the bottom of the figure. As can be easily understood, the amount of the current $I_{BL}$ flowing through a tested NMOS transistor can be ascertained by checking a sequence of values obtained as the test result TR.

Figure 6:
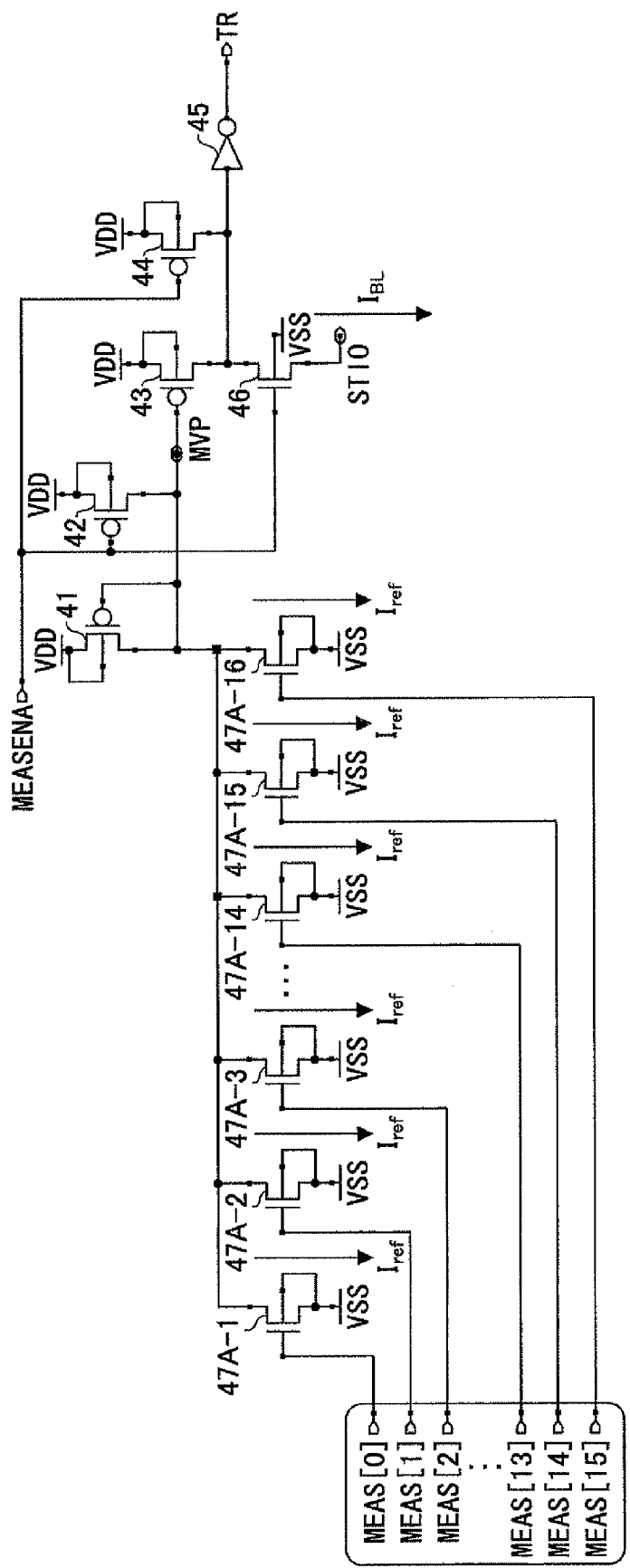
FIG. 6 is a circuit diagram illustrating another example of the configuration of the cell test circuitry.

FIG. 6 is a circuit diagram illustrating another example of the configuration of the cell test circuitry. In FIG. 6, the same elements as those of FIG. 4 are referred to by the same numerals, and a description thereof will be omitted. The cell test circuitry of FIG. 6 differs from the cell test circuitry of FIG. 4 only in that NMOS transistors 47A-1 through 47A-16 are provided in place of the NMOS transistors 47-1 through 47-16. The NMOS transistors 47A-1 through 47A-16 are configured such that their respective channel widths are identical. The reference currents are thus the same current amount $I_{ref}$.

Figure 7:
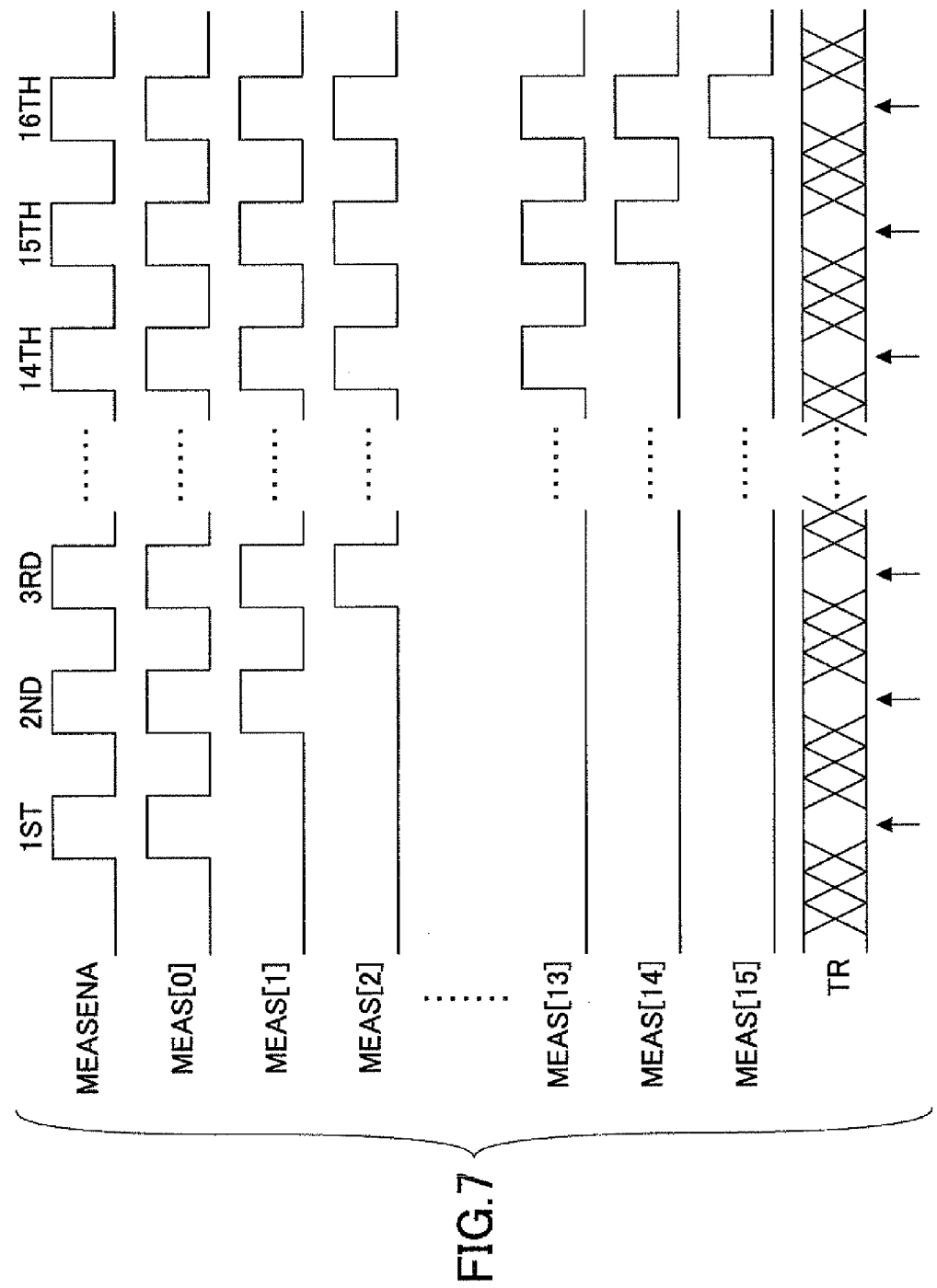
FIG. 7 is a timing chart illustrating the operation of the cell test circuitry shown in FIG. 6.

FIG. 7 is a timing chart illustrating the operation of the cell test circuitry shown in FIG. 6. As illustrated in FIG. 7, each of the reference select signals MEAS[0] through MEAS[15] has a series of consecutive pulses that starts at different timings. To be more specific, the reference select signals MEAS[0] through MEAS[15] start producing pulses in synchronization with the first through sixteenth MEASENA pulses, respectively. Once they start, these consecutive pulses continue to occur in synchronization with the subsequent pulses of the test enable signal MEASENA. At the first pulse of the test enable signal MEASENA, the reference current $I_{ref}$ is compared with the test cell current $I_{BL}$. At the second pulse of the test enable signal MEASENA, the reference current $2I_{ref}$ is compared with the test cell current $I_{BL}$. By the same token, at the n-th pulse of the test enable signal MEASENA, the reference current $nI_{ref}$ is compared with the test cell current $I_{BL}$. As can be easily understood, the amount of the current $I_{BL}$ flowing through a tested NMOS transistor can be ascertained by checking a sequence of values obtained as the test result TR.

Figure 8:
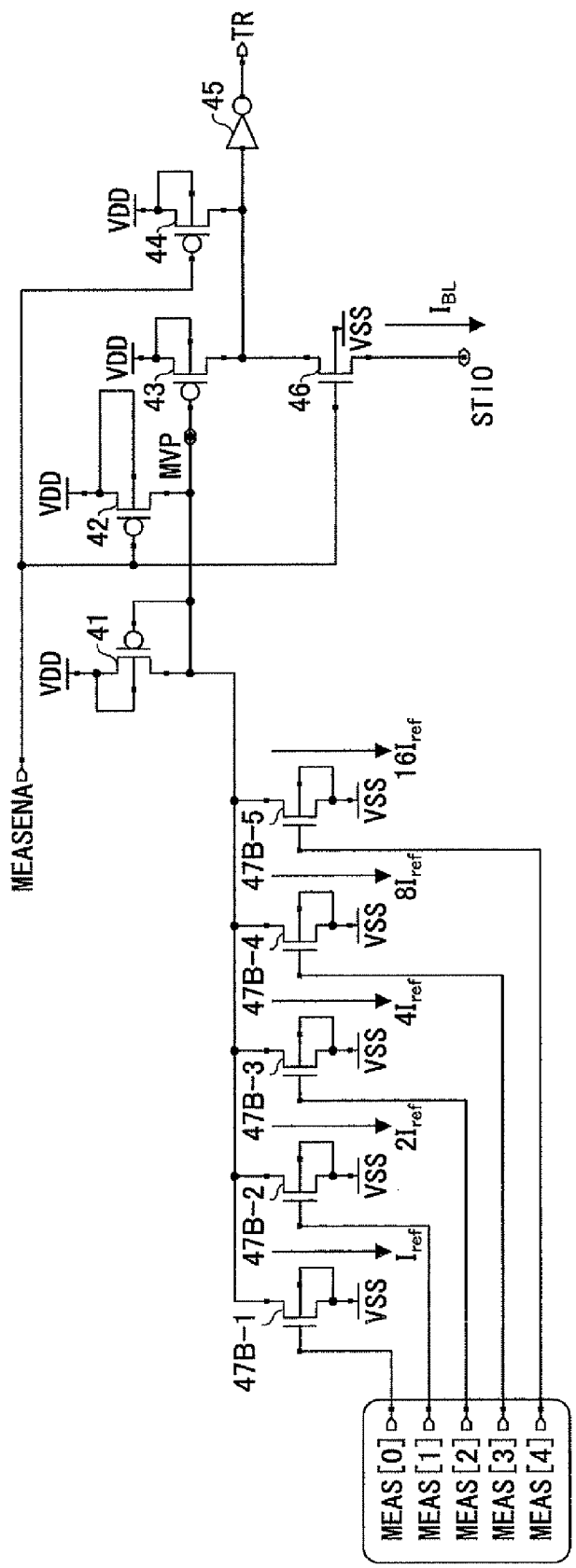
FIG. 8 is a circuit diagram illustrating another example of the configuration of the cell test circuitry.

FIG. 8 is a circuit diagram illustrating another example of the configuration of the cell test circuitry. In FIG. 8, the same elements as those of FIG. 4 are referred to by the same numerals, and a description thereof will be omitted. The cell test circuitry of FIG. 8 differs from the cell test circuitry of FIG. 4 only in that NMOS transistors 47B-1 through 47B-5 are provided in place of the NMOS transistors 47-1 through 47-16. Reference select signals MEAS[0] through MEAS[4] are applied to the gates of the NMOS transistors 47B-1 through 47B-5, respectively. The NMOS transistors 47B-1 through 47B-5 are configured such that a ratio of their respective channel widths are 1:2:4:8:16. Namely, their reference currents are expressed as $I_{ref}$, $2I_{ref}$, $4I_{ref}$, $8I_{ref}$, and $16I_{ref}$.

Figure 9:
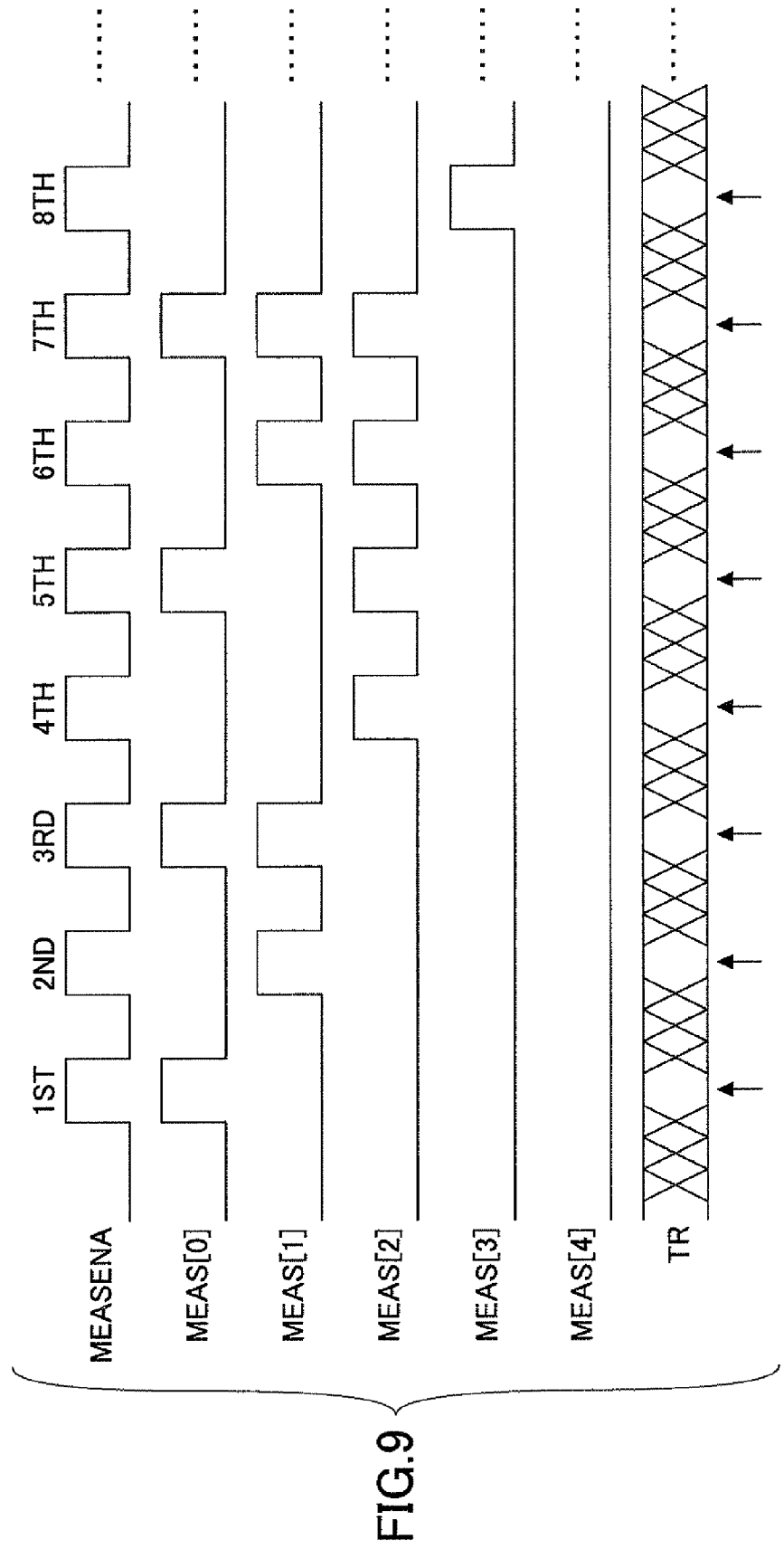
FIG. 9 is a timing chart illustrating the operation of the cell test circuitry shown in FIG. 8.

FIG. 9 is a timing chart illustrating the operation of the cell test circuitry shown in FIG. 8. As illustrated in FIG. 9, the reference select signals MEAS[0] through MEAS[4] produce pulses such that successively increasing binary numbers are provided by MEAS[0] serving as the least significant bit through MEAS[4] serving as the most significant bit in synchronization with the test enable signal MEASENA. At the first pulse of the test enable signal MEASENA, the binary number is 00001, so that the reference current $I_{ref}$ is compared with the test cell current $I_{BL}$. At the second pulse of the test enable signal MEASENA, the binary number is 00010, so that the reference current $2I_{ref}$ is compared with the test cell current $I_{BL}$. By the same token, at the n-th pulse of the test enable signal MEASENA, the reference current $nI_{ref}$ is compared with the test cell current $I_{BL}$. As can be easily understood, the amount of the current $I_{BL}$ flowing through a tested NMOS transistor can be ascertained by checking a sequence of values obtained as the test result TR.

Figure 10:
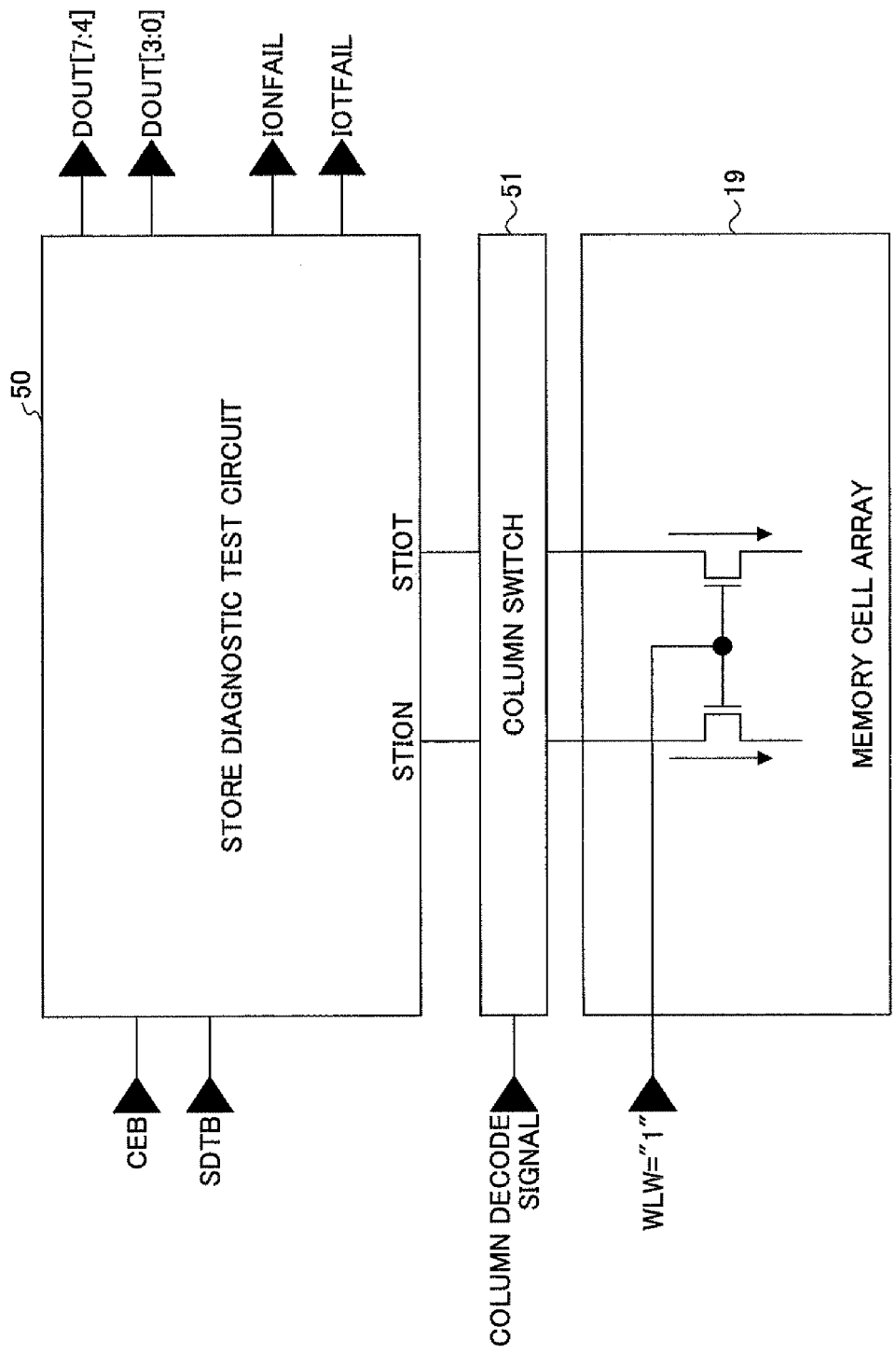
FIG. 10 is a schematic diagram illustrating a store diagnostic test circuit.

FIG. 10 is a schematic diagram illustrating a store diagnostic test circuit. A store diagnostic test circuit 50 may include the cell test circuitry illustrated in FIG. 4, FIG. 6, or FIG. 8. The store diagnostic test circuit 50 further includes a mechanism for producing the reference select signals and a mechanism for producing binary numbers indicative of test results for output to outside the semiconductor memory device 10. In the example illustrated in FIG. 10, the store diagnostic test circuit 50 is coupled to the memory cell array 19 via a column switch 51. The column switch 51 may be part of the sense amplifier & column selector 15 illustrated in FIG. 1. In response to the column decode signal from the column decoder 13 illustrated in FIG. 1, the column switch 51 couples the store diagnostic test circuit 50 to specified cell transistors to be tested in the memory cell array 19. These cell transistors may be the NMOS transistors 21 and 22 as illustrated in FIG. 2.

The store diagnostic test circuit 50 produces one-bit test result data IOTFAIL and four-bit test result data DOUT[3:0] for output to outside the semiconductor memory device 10. The one-bit test result data IOTFAIL indicates whether the true cell (i.e., NMOS transistor 21) produces an excessive amount of current that is larger than a maximum tolerable current amount. The four-bit test result data DOUT[3:0] represents a binary value indicative of an amount of current flowing through the tested true cell transistor. The store diagnostic test circuit 50 also produces one-bit test result data IONFAIL and four-bit test result data DOUT[7:4] for output to outside the semiconductor memory device 10. The one-bit test result data IONFAIL indicates whether the bar cell (i.e., NMOS transistor 22) produces an excessive amount of current that is larger than a maximum tolerable current amount. The four-bit test result data DOUT[7:4] represents a binary value indicative of an amount of current flowing through the tested bar cell transistor. In the above description, the term "true cell" refers to a memory cell that stores an intended data value, and the term "bar cell" refers to a memory cell that stores an inverse of the intended data value, which is to be compared with the data of the true cell by a sense amplifier (i.e., latch).

When the memory cell array 19 has the configuration as illustrated in FIG. 3, a single cell transistor, rather than a pair of transistors, is tested. In such a case, the store diagnostic test circuit 50 may be configured such that only one one-bit test result data IOFAIL and only one four-bit test result data DOUT[3:0] are produced for output to outside the semiconductor memory device 10. Since the store diagnostic test circuit 50 for testing a pair of cell transistors (i.e., a true cell and a bar cell) may have two identical circuit units for conducting identical tests with respect to the two cell transistors, one of two such circuit units may be easily removed to modify the store diagnostic test circuit 50 into a test circuit for testing a single cell transistor.

FIG. 11 is a table illustrating an example of the relationships between four-bit test result data DOUT and an amount of current. In this example, the four-bit binary values represented by the four-bit test result data DOUT represent an amount of current ranging from less than 5 microamperes to more than 75 microamperes. The four-bit test result data DOUT can thus inform a device outside the semiconductor memory device 10 of an amount of current that flows through the tested cell transistor.

Figure 12:
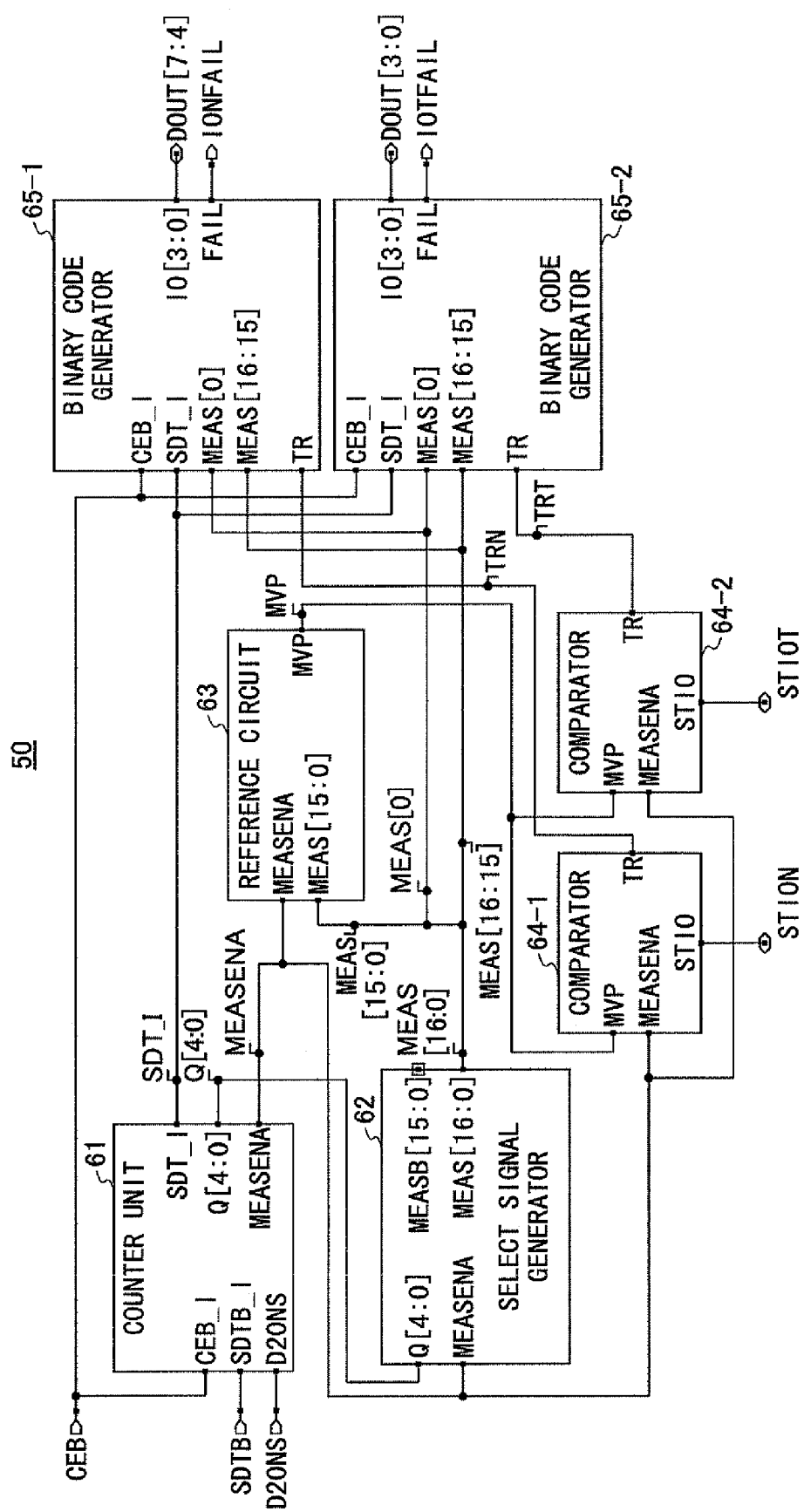
FIG. 12 is a block diagram of the store diagnostic test circuit illustrated in FIG. 10.

FIG. 12 is a block diagram of the store diagnostic test circuit illustrated in FIG. 10. The store diagnostic test circuit 50 shown in FIG. 12 includes a counter unit 61, a select signal generator 62, a reference circuit 63, comparators 64-1 and 64-2, and binary code generators 65-1 and 65-2. The counter unit 61 receives a chip enable signal CEB, which is toggled during a test operation. The counter unit 61 counts the pulses of the chip enable signal CEB to produce count signals Q[4:0] and the test enable signal MEASENA. The select signal generator 62 receives the count signals Q[4:0] and the test enable signal MEASENA to produce the reference select signals MEAS[16:0], which include MEAS[0] through MEAS[15] as illustrated in FIG. 7 and an additional signal MEAS[16]. The reference circuit 63 receives the test enable signal MEASENA and the reference select signals MEAS[15:0] to produce a reference signal MVP, which is the signal applied to the gates of the PMOS transistors 41 and 43 as illustrated in FIG. 6. In the example shown in FIG. 12, the store diagnostic test circuit 50 uses the cell test circuitry of the type illustrated in FIG. 6, in which the reference NMOS transistors 47A-1 through 47A-16 all have the same current amount.

The comparators 64-1 and 64-2 have an identical configuration. The comparator 64-1 is coupled via a node STION to a bar cell to be tested. The comparator 64-1 receives the reference signal MVP from the reference circuit 63 to produce a test result TR with respect to the bar cell transistor. The comparator 64-2 is coupled via a node STIOT to a true cell to be tested. The comparator 64-2 receives the reference signal MVP from the reference circuit 63 to produce a test result TR with respect to the true cell transistor. The binary code generators 65-1 and 65-2 have an identical configuration. Based on the test result TR for the bar cell, the binary code generator 65-1 produces the one-bit test result data IONFAIL and the four-bit test result data DOUT[7:4] for output to outside the semiconductor memory device 10. Based on the test result TR for the true cell, the binary code generator 65-2 produces the one-bit test result data IOTFAIL and the four-bit test result data DOUT[3:0] for output to outside the semiconductor memory device 10.

Figure 13:
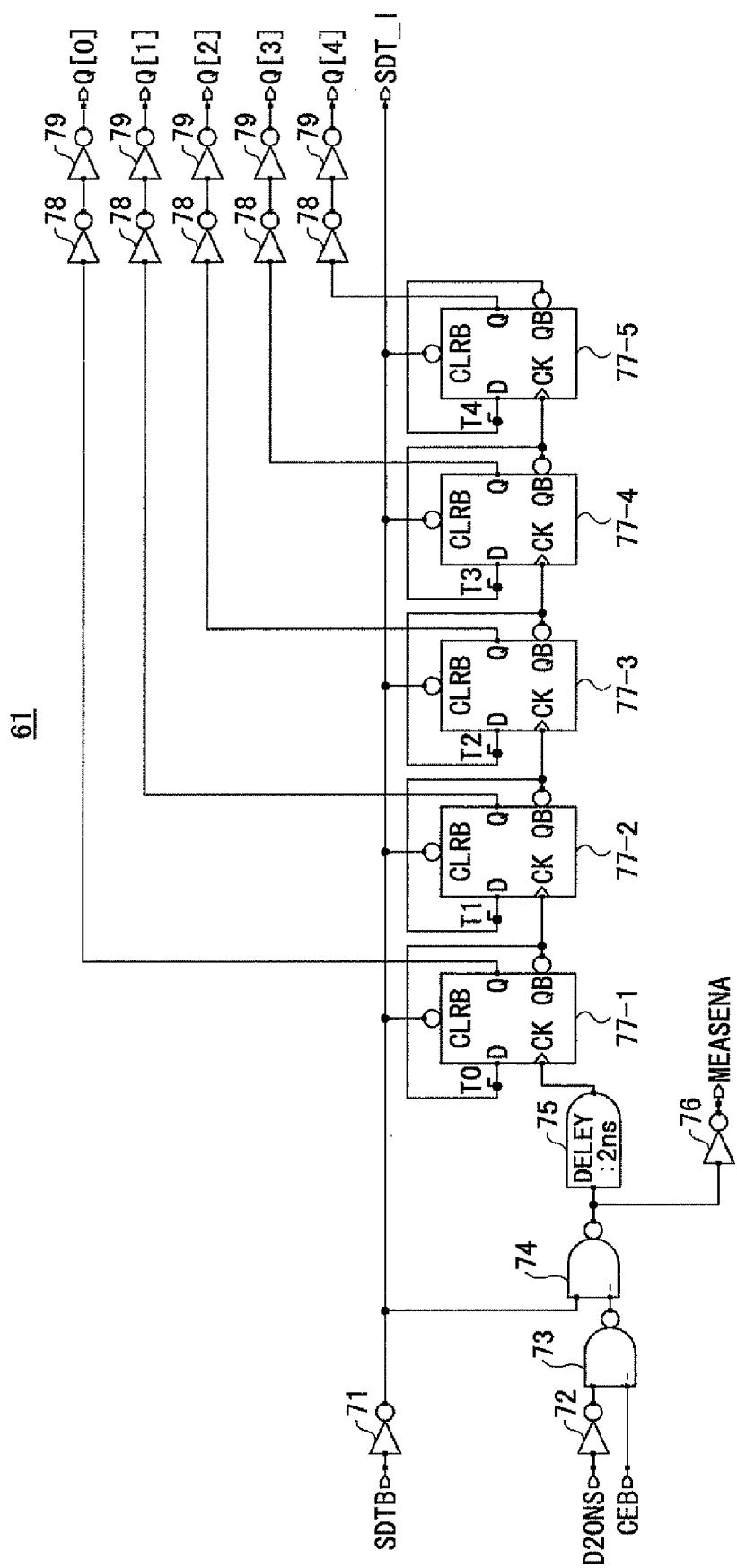
FIG. 13 is a circuit diagram illustrating an example of the configuration of a counter unit shown in FIG. 12.

FIG. 13 is a circuit diagram illustrating an example of the configuration of the counter unit 61 shown in FIG. 12. The counter unit 61 shown in FIG. 13 includes inverters 71 and 72, NAND gates 73 and 74, a delay element 75, an inverter 76, flip-flops 77-1 through 77-5, a plurality of inverters 78, and a plurality of inverters 79. A store diagnostic test signal SDTB is asserted to LOW when a test operation is conducted. With the store diagnostic test signal SDTB being LOW, the flip-flops 77-1 through 77-5 which constitute a counter counts pulses applied to the clock input node of the flip-flop 77-1. These pulses are generated from the toggling chip enable signal CEB. In FIG. 13, a signal D20NS is generated by delaying the chip enable signal CEB by 20 nanoseconds. The test enable signal MEASENA is also generated from the toggling chip enable signal CEB. A five-bit count value obtained by the flip-flops 77-1 through 77-5 are output as the count signals Q[0] through Q[4] (i.e., Q[4:0] illustrated in FIG. 12). Further, an inverse of the store diagnostic test signal SDTB is output as an inverted diagnostic test signal SDT_I.

Figure 14:
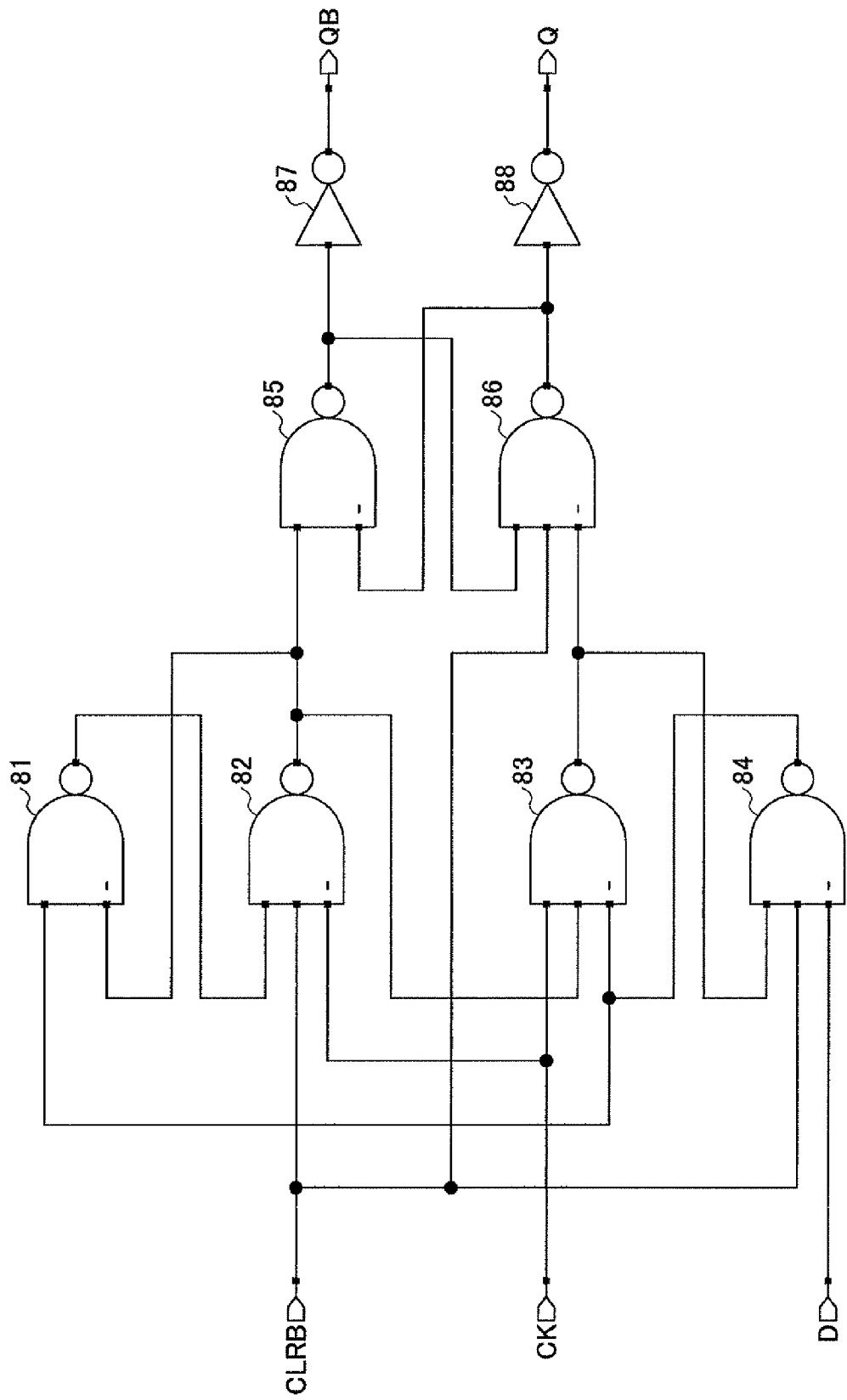
FIG. 14 is a circuit diagram showing an example of a flip flop used in FIG. 13.

FIG. 14 is a circuit diagram showing an example of a flip flop that is used as any given one of the flip-flops 77-1 through 77-5 illustrated in FIG. 13. The flip-flop of FIG. 14 includes NAND gates 81 through 86 and inverters 87 and 88. As shown in FIG. 13, the QB output is fed back into the D input with respect to each flip-flop, and the flip-flops 77-1 through 77-5 are cascade-connected to form a counter.

Figure 15:
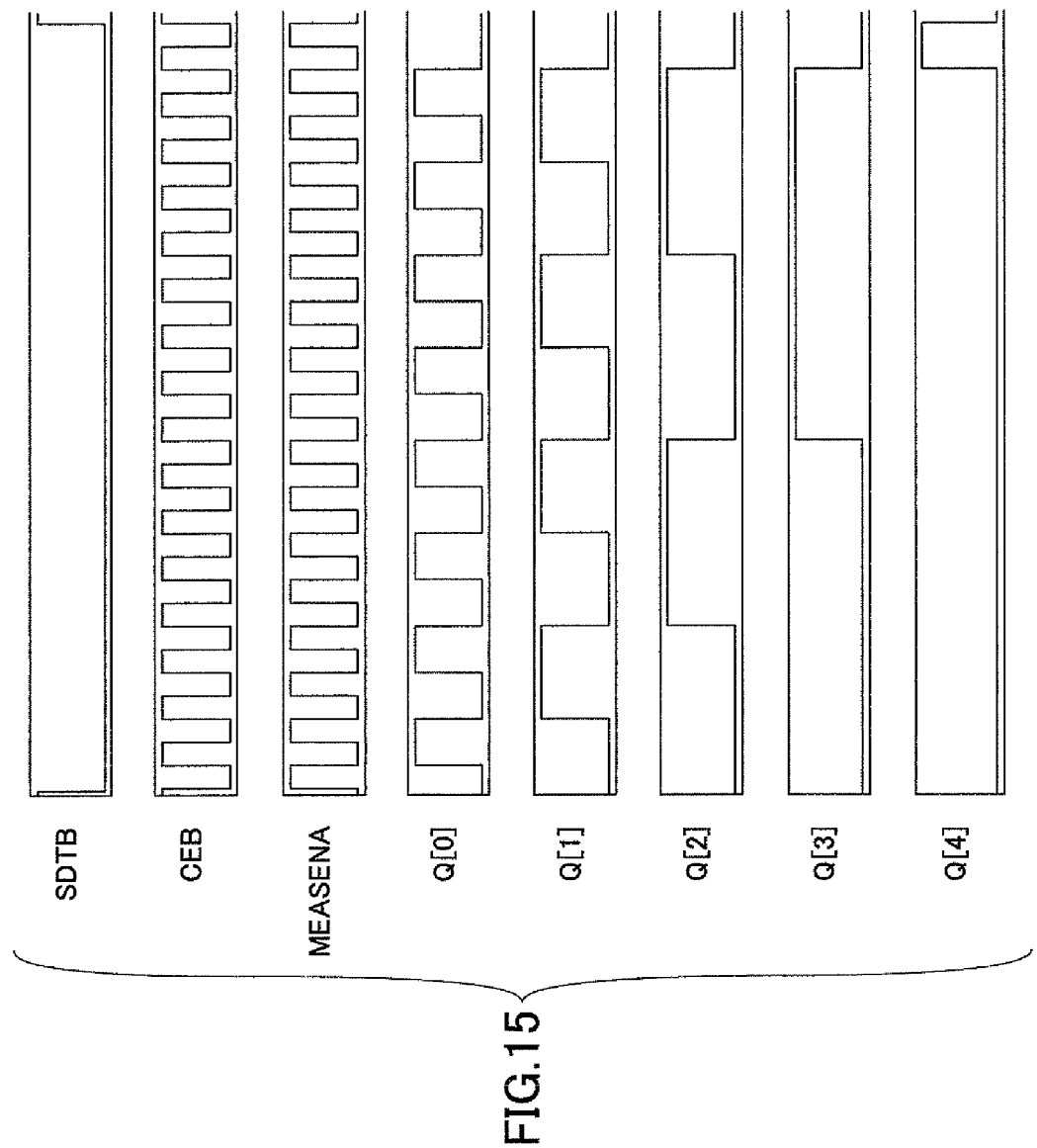
FIG. 15 is a drawing showing signal waveforms that illustrate an example of the operation of the counter unit depicted in FIG. 13.

FIG. 15 is a drawing showing signal waveforms that illustrate an example of the operation of the counter unit 61 depicted in FIG. 13. As illustrated in FIG. 15, the store diagnostic test signal SDTB is set to LOW to activate a test operation. During the test operation, the chip enable signal CEB is toggled between HIGH and LOW. In synchronization with the toggling chip enable signal CEB, the test enable signal MEASENA exhibits HIGH pulses, which are counted by the counter comprised of the flip-flops 77-1 through 77-5 shown in FIG. 13. A count value obtained in this manner is output as the five-bit count signals Q[0] through Q[4] as demonstrated in FIG. 15.

Figure 16:
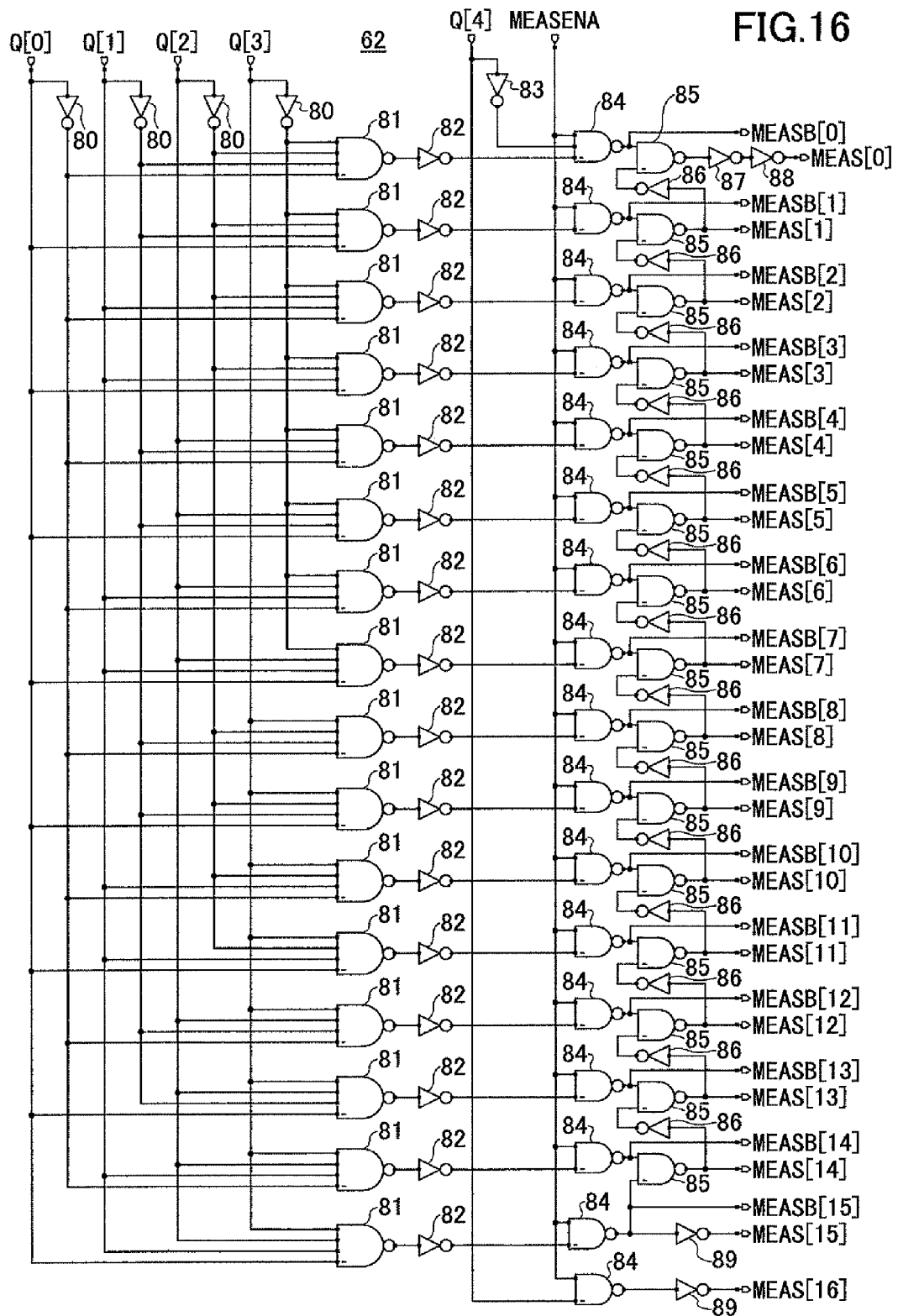
FIG. 16 is a circuit diagram illustrating an example of the configuration of a select signal generator shown in FIG. 12.

FIG. 16 is a circuit diagram illustrating an example of the configuration of the select signal generator 62 shown in FIG. 12. The select signal generator 62 of FIG. 16 includes a plurality of inverters 80, a plurality of NAND gates 81, a plurality of inverters 82, an inverter 83, a plurality of NAND gates 84, a plurality of NAND gates 85, a plurality of inverters 86, an inverter 87, an inverter 88, and a plurality of inverters 89. The plurality of inverters 80, the plurality of NAND gates 81, and the plurality of inverters 82 constitute a decoder that produces decode signals, one of which is asserted in response to a corresponding one of the counts ranging from 0 to 15. The plurality of NAND gates 84, the plurality of NAND gates 85, and the plurality of inverters 86 serve to produce a HIGH pulse in MEAS[0] through MEAS[n−1] when MEAS[n] is asserted to HIGH in response to the corresponding decode signal. Further, MEASB[0] through MEASB[15] are produced in one-to-one correspondence to the respective decode signals (i.e., respective counts).

Figure 17A:
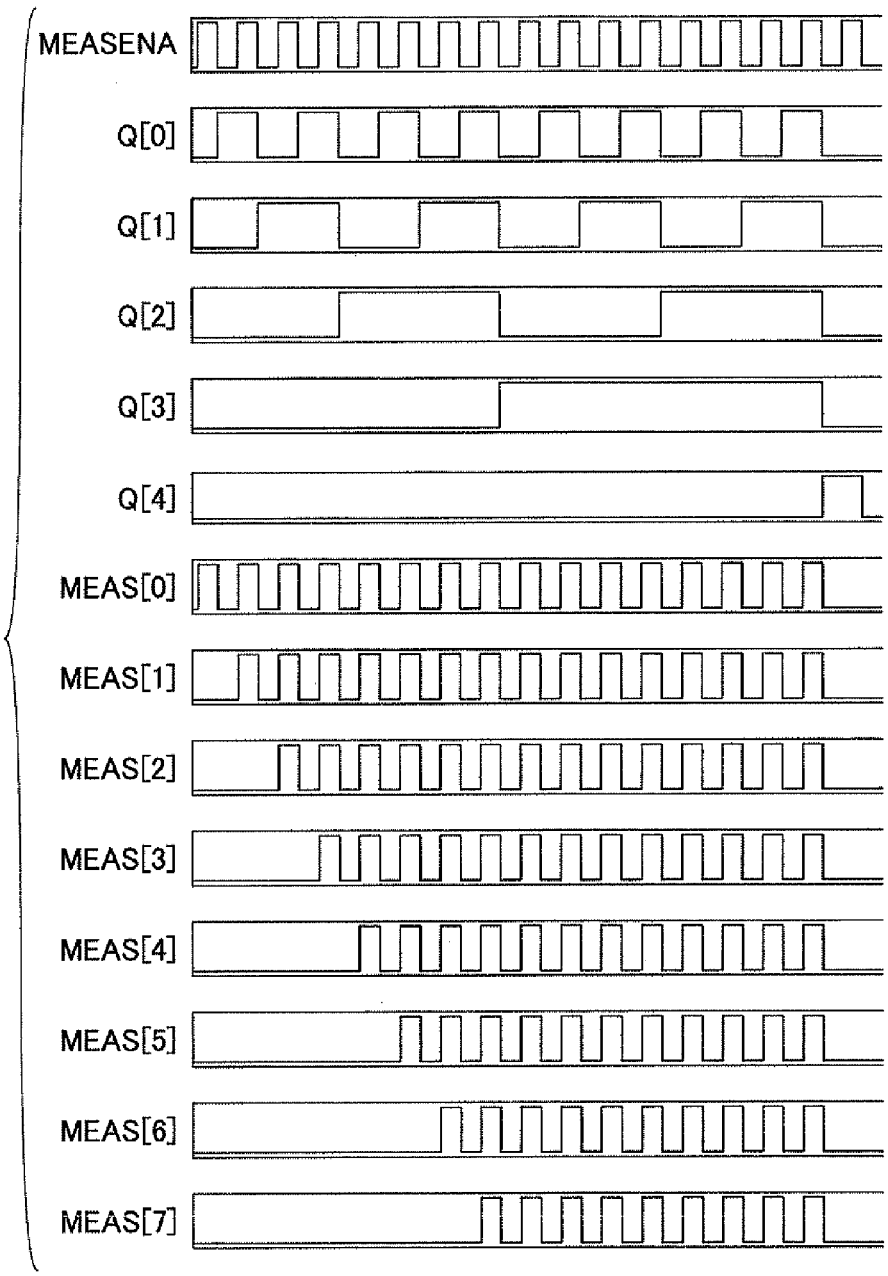

FIGS. 17A through 17D are drawings showing signal waveforms that illustrate an example of the operation of the select signal generator 62 depicted in FIG. 16. FIG. 17A shows MEAS[0] through MEAS[7], and FIG. 17B shows remaining MEAS[8] through MEAS[16]. As illustrated in FIGS. 17A and 178, each of the reference select signals MEAS[0] through MEAS[15] has a series of consecutive pulses that starts at different timings. To be more specific, the reference select signals MEAS[0] through MEAS[15] start producing pulses in synchronization with the first through sixteenth MEASENA pulses, respectively. Once they start, these consecutive pulses continue to occur in synchronization with the subsequent pulses of the test enable signal MEASENA. All the series of consecutive pulses of MEAS[0] through MEAS[15] stop at the seventeenth MEASENA pulse. As a result, MEAS[15] is changed to HIGH only once at the sixteenth MEASENA pulse. Further, MEAS[16] becomes HIGH only once at the seventeenth MEASENA pulse. Such reference select signals MEAS[0] through MEAS[16] are produced based on the count signals Q[0] through Q[4] as described in connection with FIG. 16.

Figure 17C:
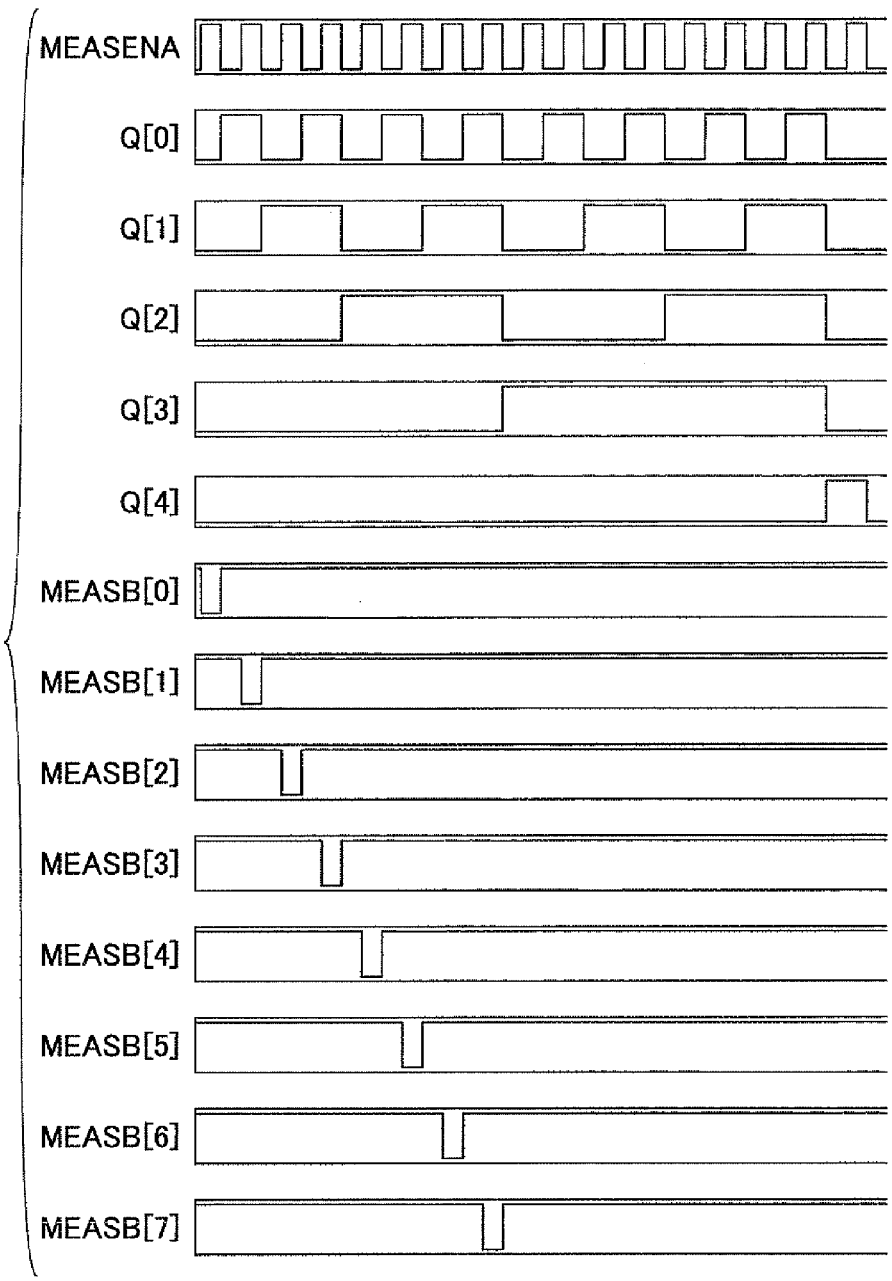
Figure 17D:
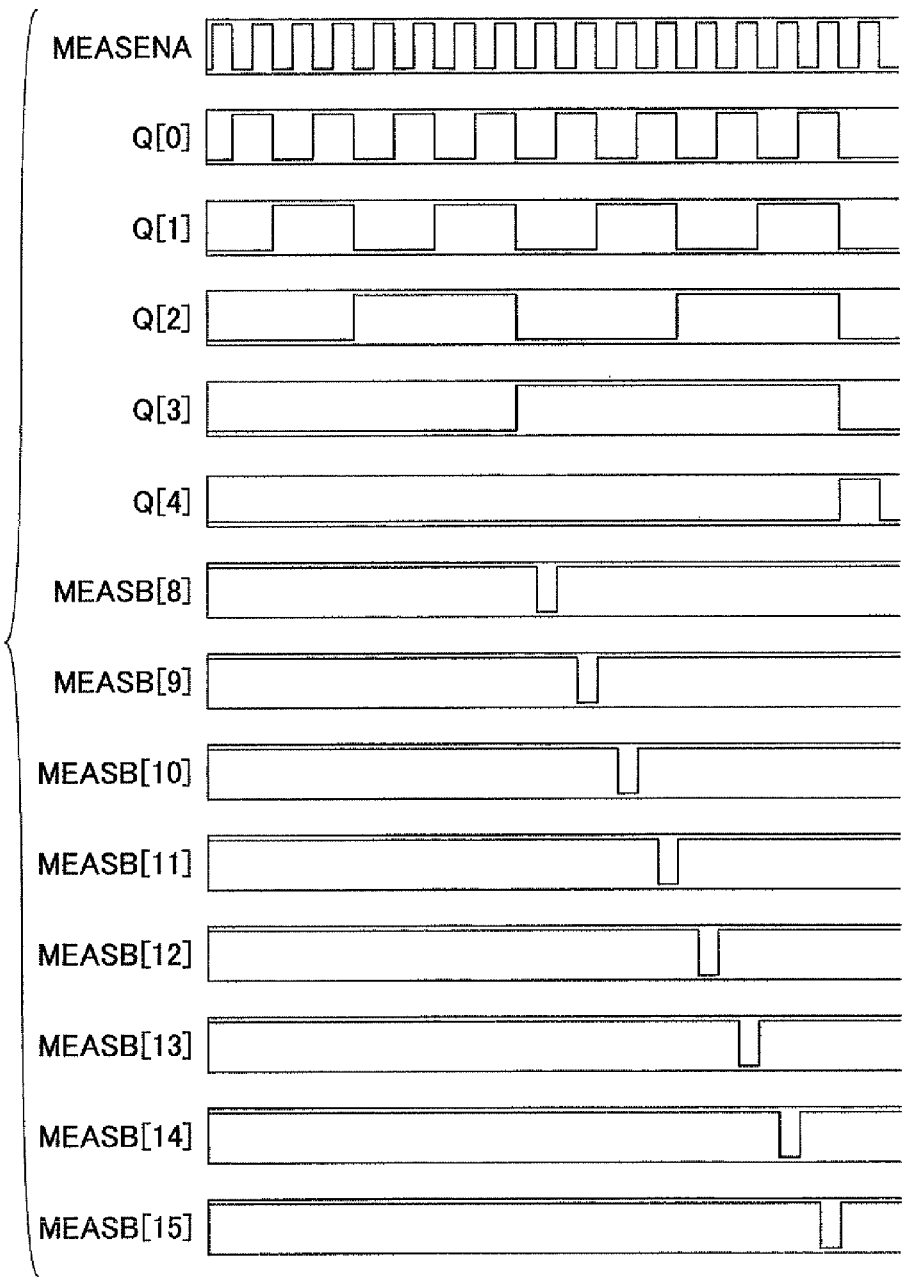

FIG. 17C shows MEASB[0] through MEASB[7], and FIG. 17D shows remaining MEASB[8] through MEASB[15]. Signals MEASB[0] through MEASB[15], which stay HIGH except for a predetermined LOW pulse period, successively exhibit a LOW pulse in an ascending order of index numbers in synchronization with the pulses of test enable signal MEASENA. Namely, MEASB[x] (x=0, 1, 2, . . . , 15) has a LOW pulse at the (x+1)-th pulse of the test enable signal MEASENA. Such signals MEASB[0] through MEASB[15] are produced based on the count signals Q[0] through Q[4] as described in connection with FIG. 16.

Figure 18:
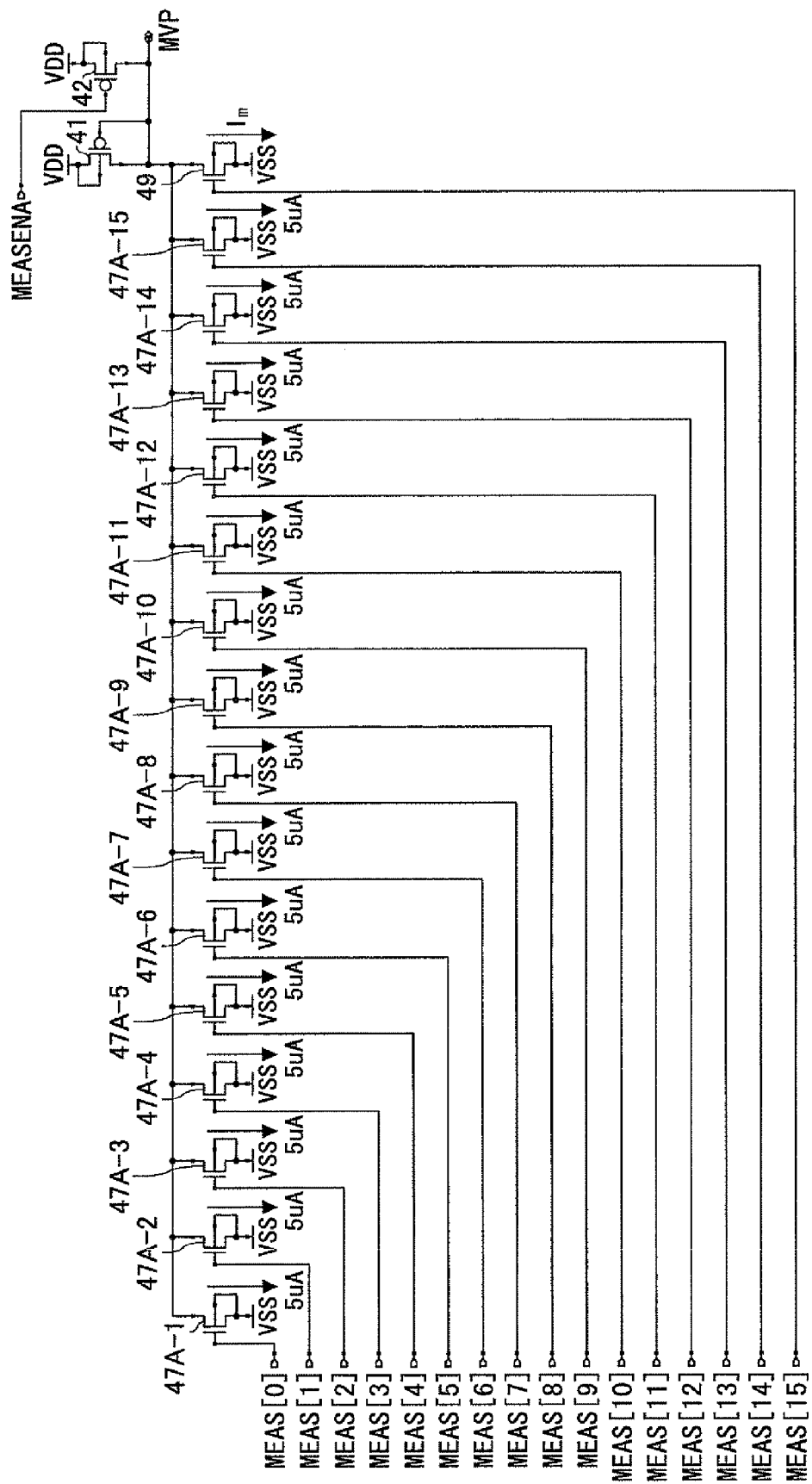
FIG. 18 is a circuit diagram illustrating an example of the configuration of a reference circuit shown in FIG. 12.

FIG. 18 is a circuit diagram illustrating an example of the configuration of the reference circuit 63 shown in FIG. 12. In FIG. 18, the same elements as those of FIG. 6 are referred to by the same numerals, and a description thereof will be omitted. In FIG. 18, a NMOS transistor 49 is provided in place of the NMOS transistor 47A-16. In FIG. 6, the amount of current flowing through the NMOS transistor 47A-16 is equal to the amount of current flowing through each of the NMOS transistors 47A-1 through 47A-15. In FIG. 18, the amount of current Im flowing through the NMOS transistor 49 may be different from the amount of current (i.e., 5 microamperes in this example) flowing through each of the NMOS transistors 47A-1 through 47A-15. The NMOS transistor 49 is designed such that the amount of current Im plus 75 microamperes (=15×5 microamperes) is substantially equal to a maximum tolerable current amount allowed to flow through a cell transistor. With this provision, it is possible to compare the cell transistor current $I_{BL}$ with the maximum tolerable current amount.

Figure 19:
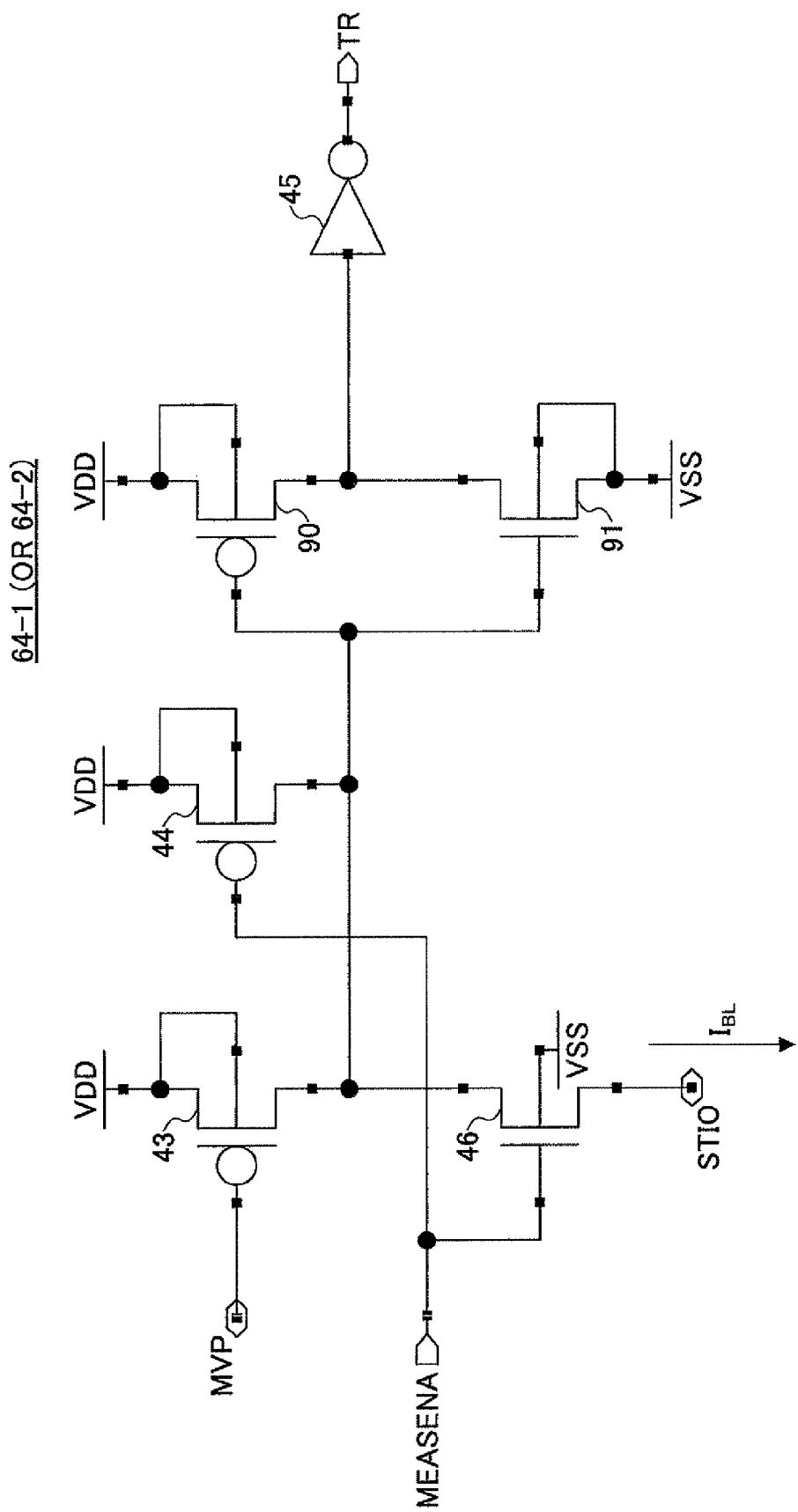
FIG. 19 is a circuit diagram illustrating an example of the configuration of a comparator shown in FIG. 12.

FIG. 19 is a circuit diagram illustrating an example of the configuration of the comparator 64-1 or 64-2 shown in FIG. 12. The comparators 64-1 and 64-2 have the identical configuration illustrated in FIG. 19. In FIG. 19, the same elements as those of FIG. 6 are referred to by the same numerals, and a description thereof will be omitted. The comparator of FIG. 19 includes a PMOS transistor 90 and an NMOS transistor 91 constituting an additional inverter in addition to the corresponding circuit portion illustrated in FIG. 6. It should be noted that the logic value of the test result TR is inverted from the one shown in FIG. 6 because of the presence of this additional inverter. That is, the test result TR is LOW when the reference current is smaller than the test current $I_{BL}$, and is HIGH when the reference current is larger than the test current $I_{BL}$.

Figure 20:
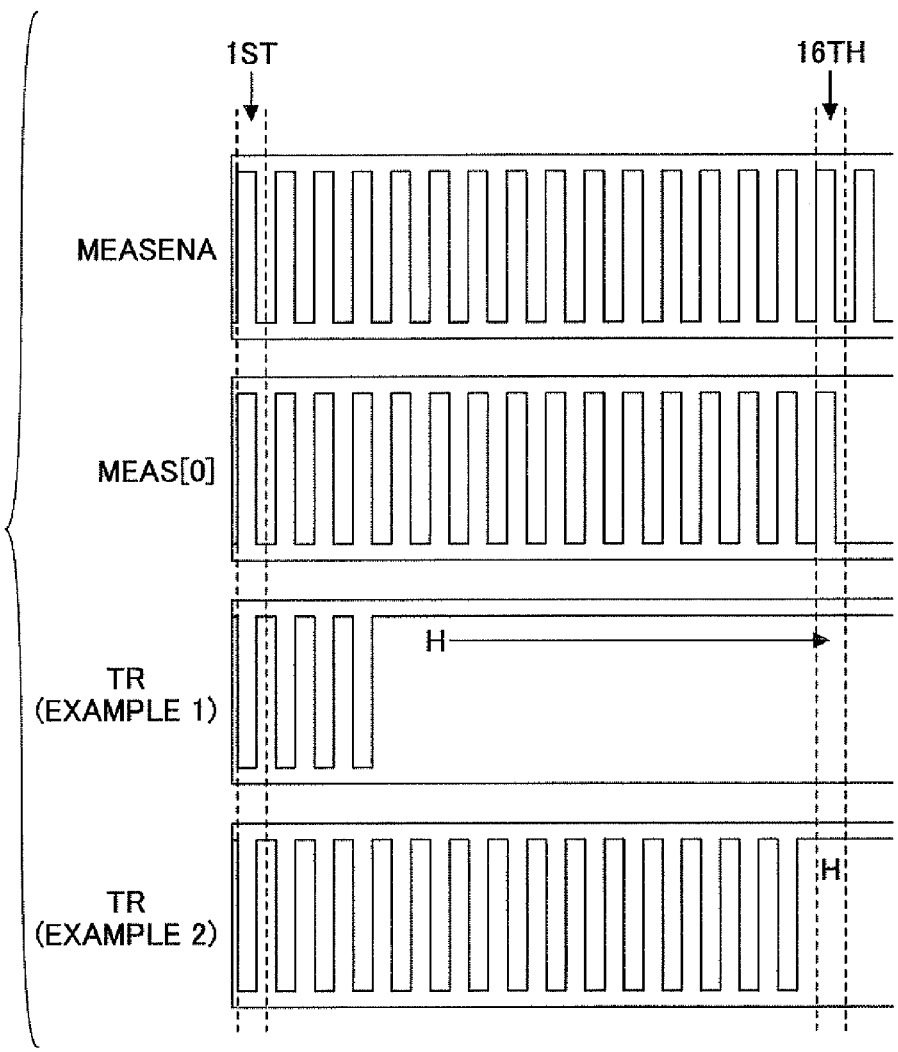
FIG. 20 is a drawing showing signal waveforms that illustrate an example of the operation of the reference circuit of FIG. 18 and the comparator of FIG. 19.

FIG. 20 is a drawing showing signal waveforms that illustrate an example of the operation of the reference circuit 63 of FIG. 18 and the comparator 64-1 or 64-2 of FIG. 19. FIG. 20 shows the test enable signal MEASENA, the reference select signal MEAS[0], and two example waveforms of the test result TR. The test result TR of EXAMPLE 1 stays LOW at the HIGH pulses of the test enable signal MEASENA up to the fourth pulse. The test result TR of EXAMPLE 1 then becomes HIGH at the fifth pulse of the test enable signal MEASENA, and stays HIGH thereafter. Such a test result TR indicates that the test current $I_{BL}$ is in the range of 20 microamperes to 25 microamperes. The test result TR of EXAMPLE 2 stays LOW at the HIGH pulses of the test enable signal MEASENA up to the fifteenth pulse. The test result TR of EXAMPLE 2 then becomes HIGH at the sixteenth pulse of the test enable signal MEASENA, and stays HIGH thereafter. Such a test result TR indicates that the test current $I_{BL}$ is more than 75 microamperes but less than the maximum tolerable current amount.

Figure 21:
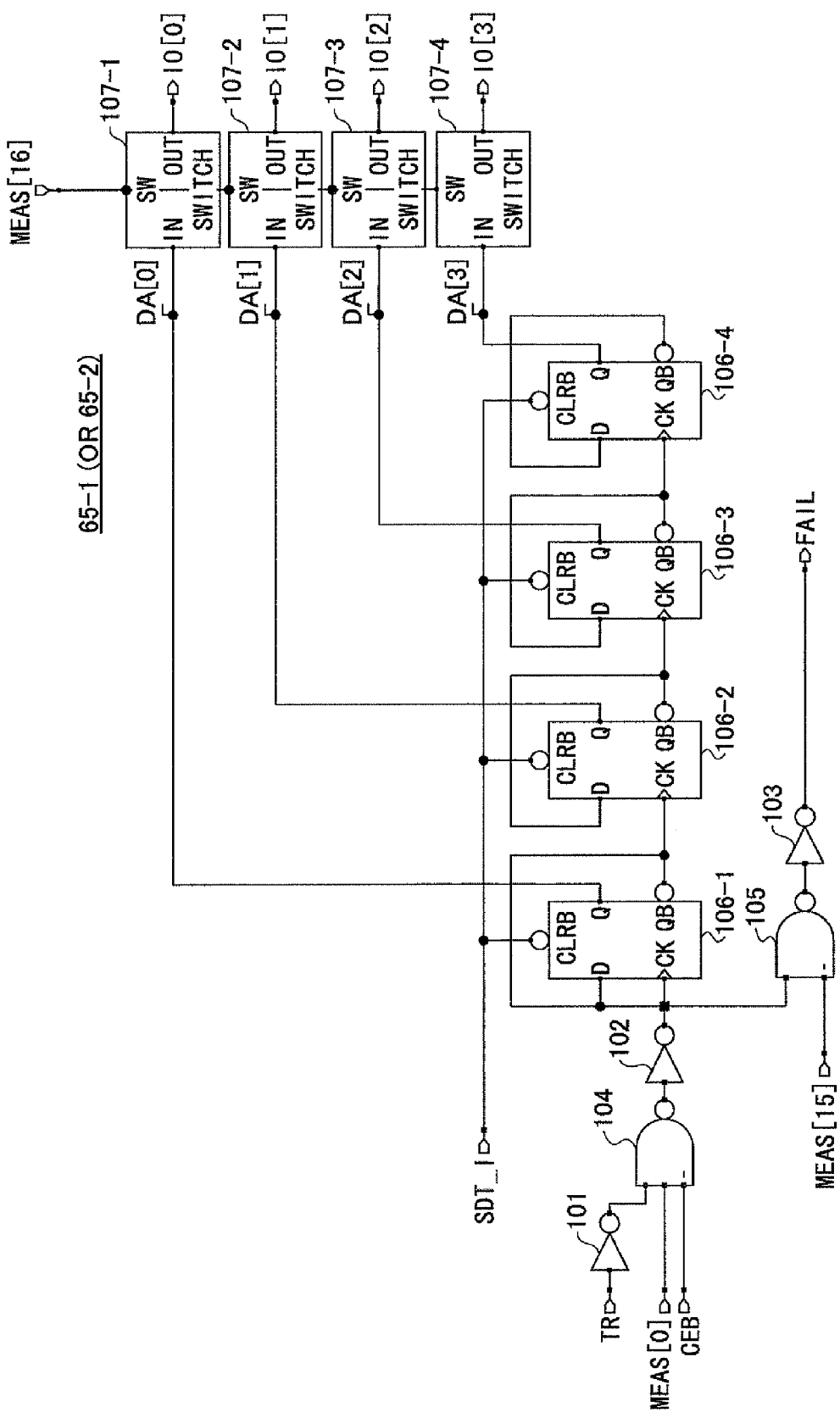
FIG. 21 is a circuit diagram illustrating an example of the configuration of a binary code generator shown in FIG. 12.
Figure 22:
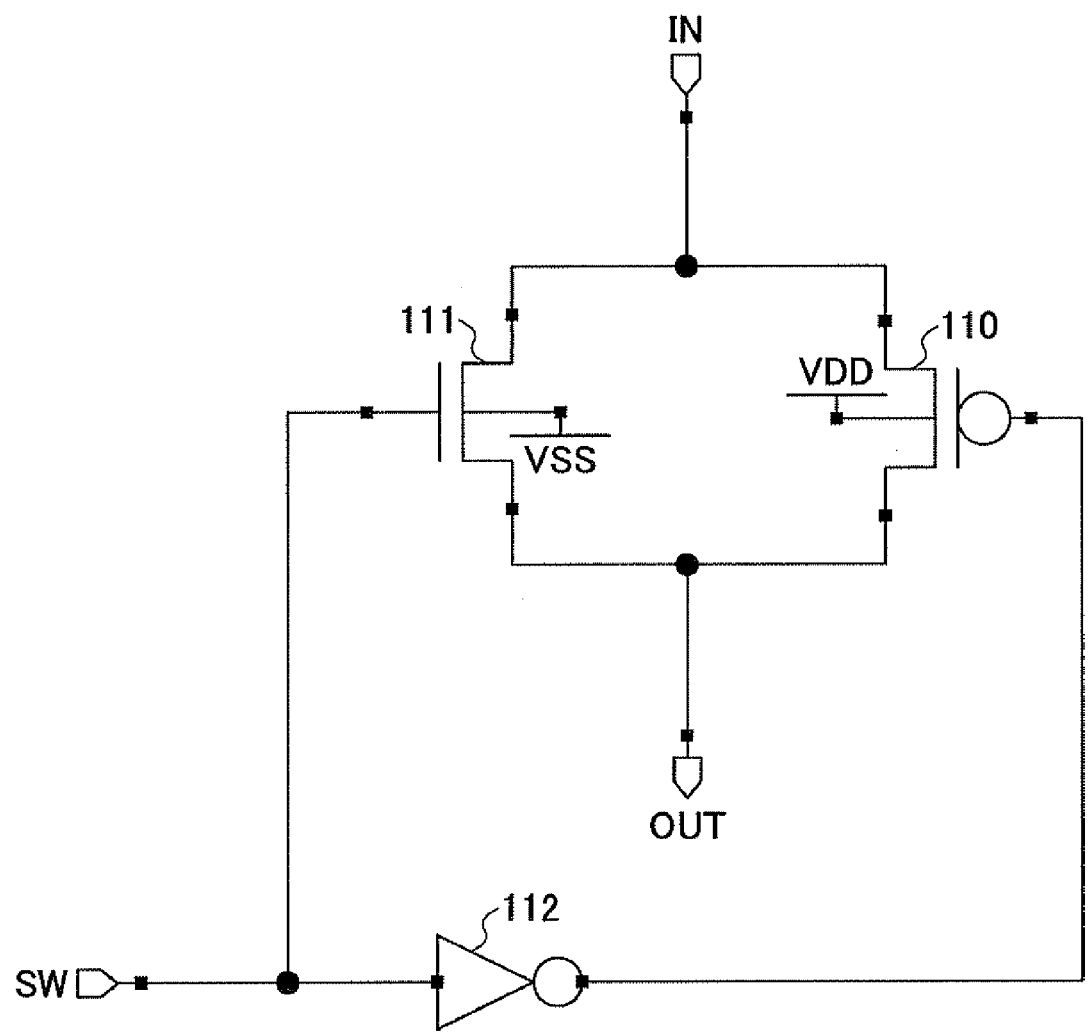
FIG. 22 is a circuit diagram of a switch circuit.

FIG. 21 is a circuit diagram illustrating an example of the configuration of the binary code generator 65-1 or 65-2 shown in FIG. 12. The binary code generators 65-1 and 65-2 have an identical configuration illustrated in FIG. 21. The binary code generator of FIG. 21 includes inverters 101 through 103, NAND gates 104 and 105, flip-flops 106-1 through 106-4, and switch circuits 107-1 through 107-4. Each of the flip-flops 106-1 through 106-4 may have the configuration illustrated in FIG. 14. Each of the switch circuits 107-1 through 107-4 may include a PMOS transistor 110, an NMOS transistor 111, and an inverter 112 as illustrated in FIG. 22.

A counter comprised of the flip-flops 106-1 through 106-4 counts up in response to the toggling chip enable signal CEB and the reference select signal MEAS[0] while the test result TR is LOW. Once the test result TR changes to HIGH, the counter comprised of the flip-flops 106-1 through 106-4 stops counting, leaving the last stored count intact. The last count data DA[0] through DA[3] of the counter is then output from IO nodes IO[0] through IO[3] of the binary code generator, i.e., output from IO[3:0] of the binary code generator 65-1 or 65-2 illustrated in FIG. 12. Moreover, the output of the inverter 102 observed at the sixteenth MEASENA pulse (i.e., observed at the pulse of MEAS[15]) is output from a node FAIL of the binary code generator.

Figure 23:
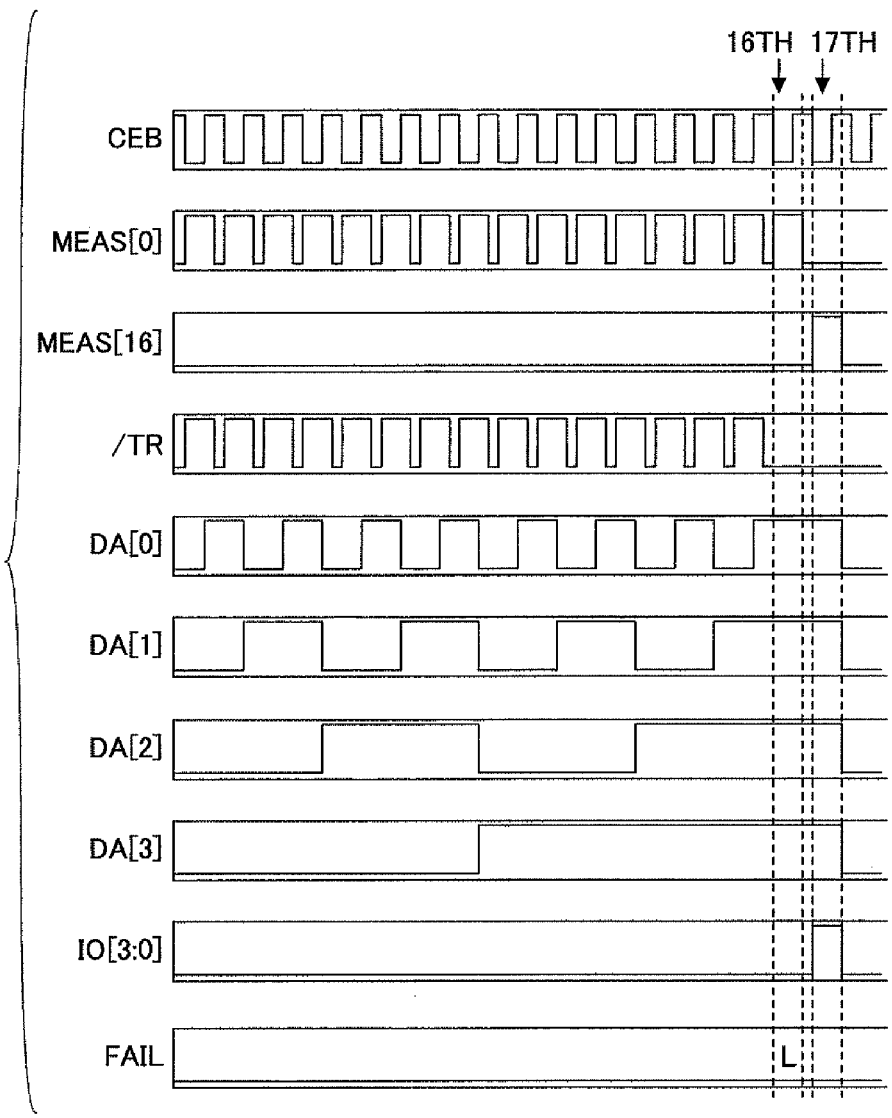
FIG. 23 is a drawing showing signal waveforms that illustrate an example of the operation of the binary code generator depicted in FIG. 21.

FIG. 23 is a drawing showing signal waveforms that illustrate an example of the operation of the binary code generator 65-1 or 65-2 depicted in FIG. 21. In this example, the test result TR becomes HIGH at the sixteenth MEASENA pulse. Namely, an inverted test result /TR as shown in FIG. 23 becomes LOW at the sixteenth pulse of the reference select signal MEAS[0]. As a result, the count data DA[0] through DA[3] are all "1", indicating that the test current $I_{BL}$ is larger than 75 microamperes (=5×15 microamperes). The signal output from the FAIL node in response to the pulse of the reference select signal MEAS[15] (see FIG. 21) is LOW at the sixteenth pulse of the reference select signal MEAS[0] (see the letter "L" at the bottom of FIG. 23). This LOW output indicates that the test current $I_{BL}$ is smaller than the maximum tolerable current amount. In this manner, the count data DA[0] through DA[3] and the FAIL output signal together indicate the result of comparison of the test current $I_{BL}$ with a reference current.

Figure 24:
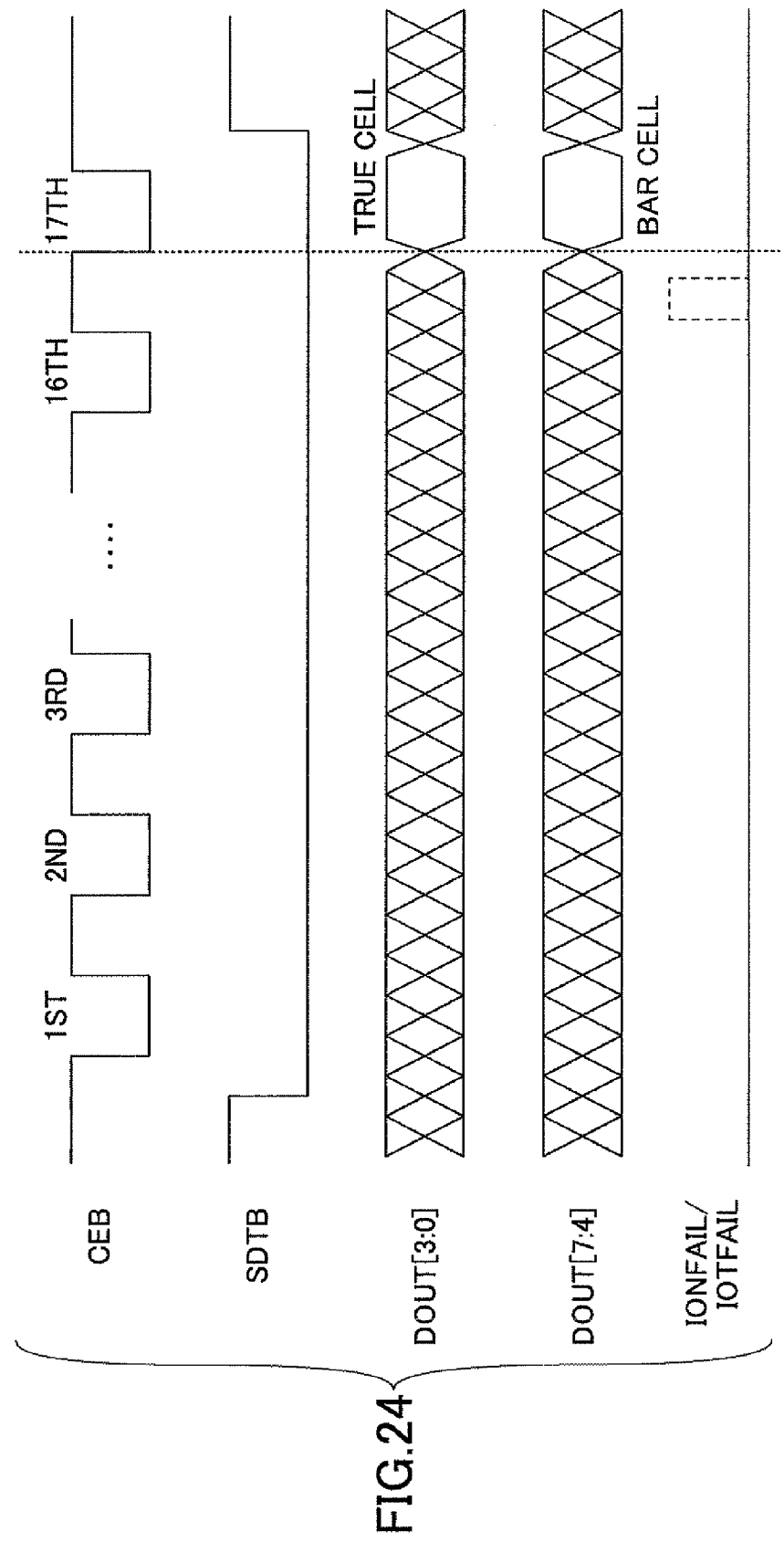
FIG. 24 is a drawing showing signal waveforms that illustrate the operation of a store diagnostic test circuit depicted in FIG. 12.

FIG. 24 is a drawing showing signal waveforms that illustrate the operation of the store diagnostic test circuit 50 depicted in FIG. 12. As described in connection with FIG. 23, the binary code generators 65-1 and 65-2 of the store diagnostic test circuit 50 output the result of comparison obtained by comparing the test current $I_{BL}$ with a reference current. As illustrated in FIG. 24, the store diagnostic test signal SDTB is set to LOW to indicate a start of a test operation. The chip enable signal CEB is then toggled. In each cycle defined by the toggling CEB, the test current $I_{BL}$ is compared with a reference current. The amount of this reference current is 5n microamperes in the n-th cycle up to the fifteenth cycle. In the sixteenth cycle, the amount of the reference current is equal to the maximum tolerable current amount. In the seventeenth cycle, data indicative of a current amount detected for a tested true cell is output as D[3:0], and data indicative of a current amount detected for a tested bar cell is output as D[7:4]. Further, the presence of a HIGH pulse in the signal IONFAIL or IOTFAIL at the end of the sixteenth cycle indicates that a tested cell has a current amount exceeding the maximum tolerable current amount. The absence of such a HIGH pulse indicates that a tested cell has a current amount smaller than the maximum tolerable current amount.

In the store diagnostic test circuit 50 described above, it is expected that the test result TR exhibits LOW pulses when a reference current is below the test current $I_{BL}$, and stays HIGH after a reference current exceeds the test current $I_{BL}$. In some cases, however, the test result may exhibit an undesirable behavior due to noise.

Figure 25:
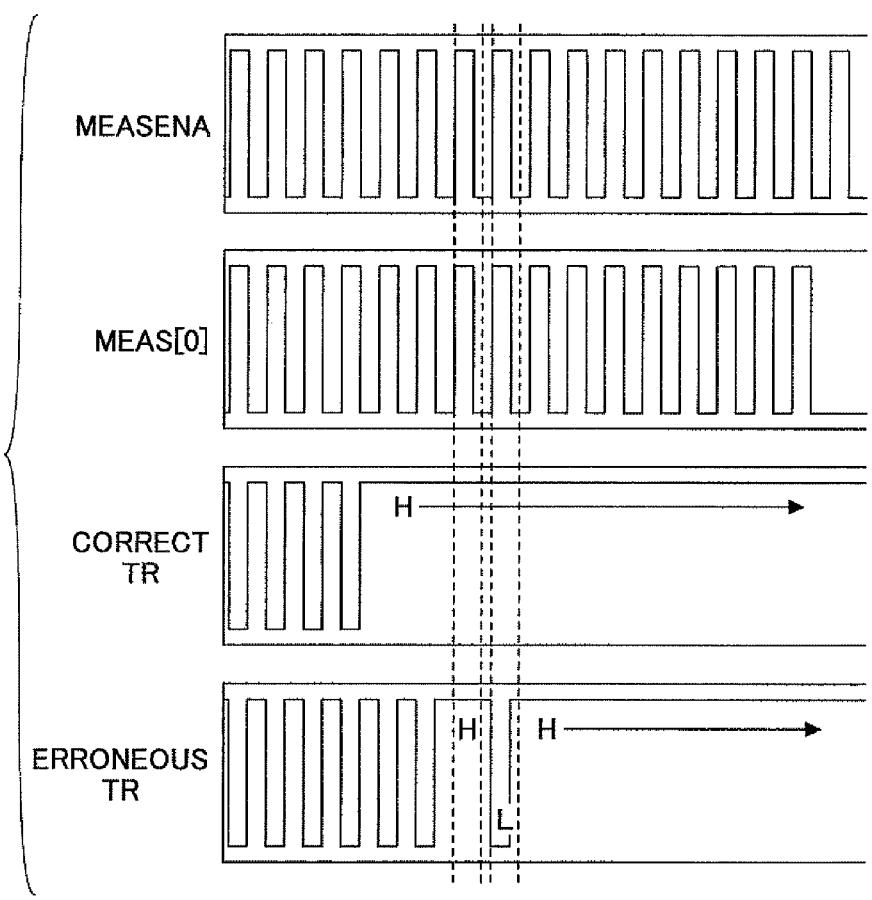
FIG. 25 is a drawing showing signal waveforms that illustrate examples of erroneous operations of the store diagnostic test circuit.

FIG. 25 is a drawing showing signal waveforms that illustrate examples of erroneous operations of the store diagnostic test circuit 50. The test result TR in a correct case (as demonstrated as CORRECT TR) stays HIGH after a certain cycle in which the amount of reference current exceeds the amount of a test current flowing through a tested cell transistor. On the other hand, the test result TR in an erroneous case (as demonstrated as ERRONEOUS TR) stays HIGH for one or more cycles, and then returns to LOW in a subsequent cycle. When the test result TR exhibits such a signal transition pattern, the store diagnostic test circuit 50 illustrated in FIG. 12 outputs count data indicative of the total number of LOW pulses appearing in the test result TR. Such output data may not be preferable under certain circumstances. In the following, a description will be given of a store diagnostic test circuit that takes into account the occurrence of an erroneous test result TR.

Figure 26:
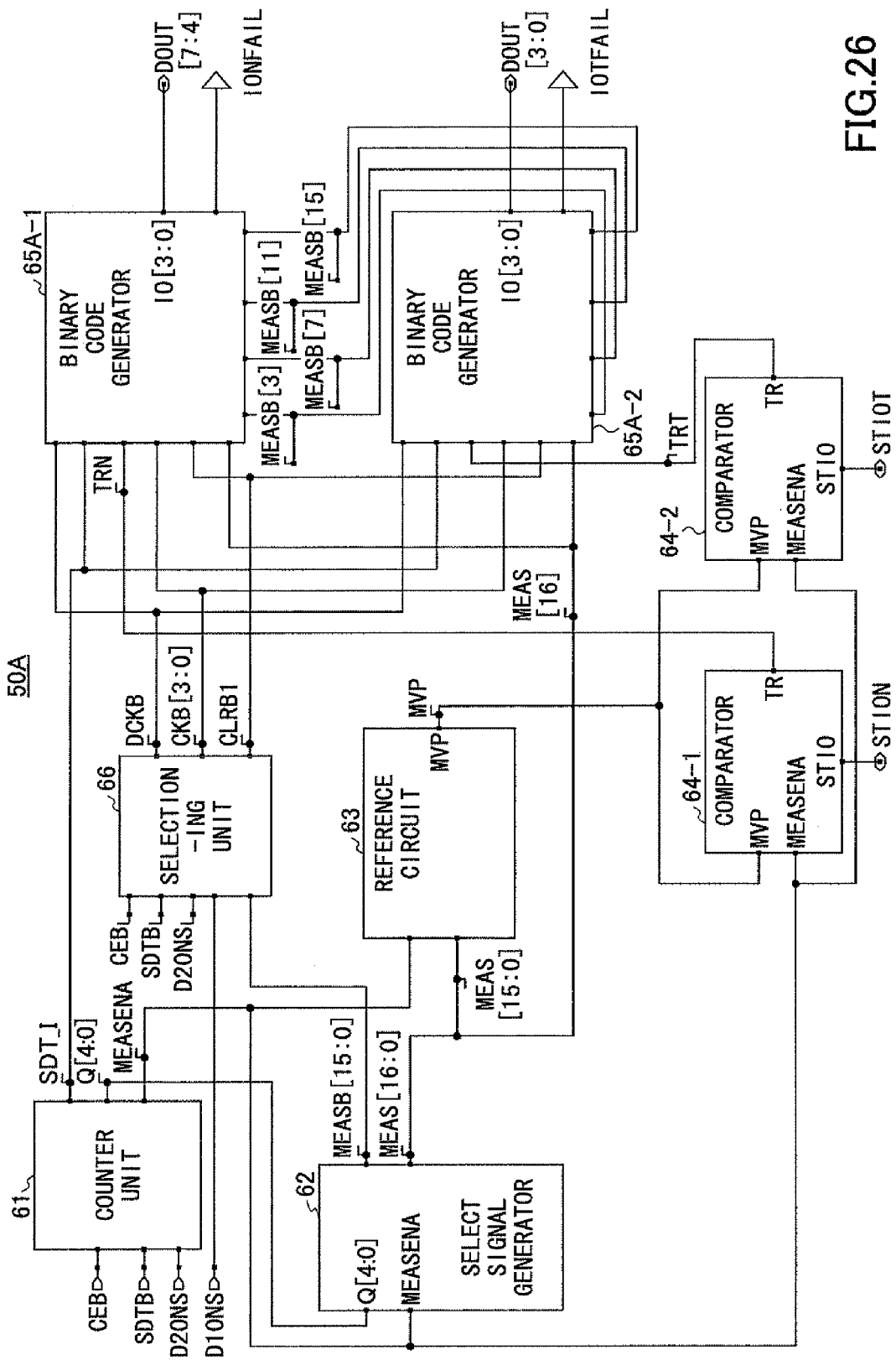
FIG. 26 is a block diagram of another example of the store diagnostic test circuit illustrated in FIG. 10.

FIG. 26 is a block diagram of another example of the store diagnostic test circuit illustrated in FIG. 10. In FIG. 26, the same elements as those of FIG. 12 are referred to by the same numerals, and a description thereof will be omitted. A store diagnostic test circuit 50A shown in FIG. 26 differs from the store diagnostic test circuit 50 of FIG. 12 in that a sectioning unit 66 is additionally provided, and in that the binary code generators 65-1 and 65-2 are replaced with binary code generators 65A-1 and 65A-2.

Figure 27:
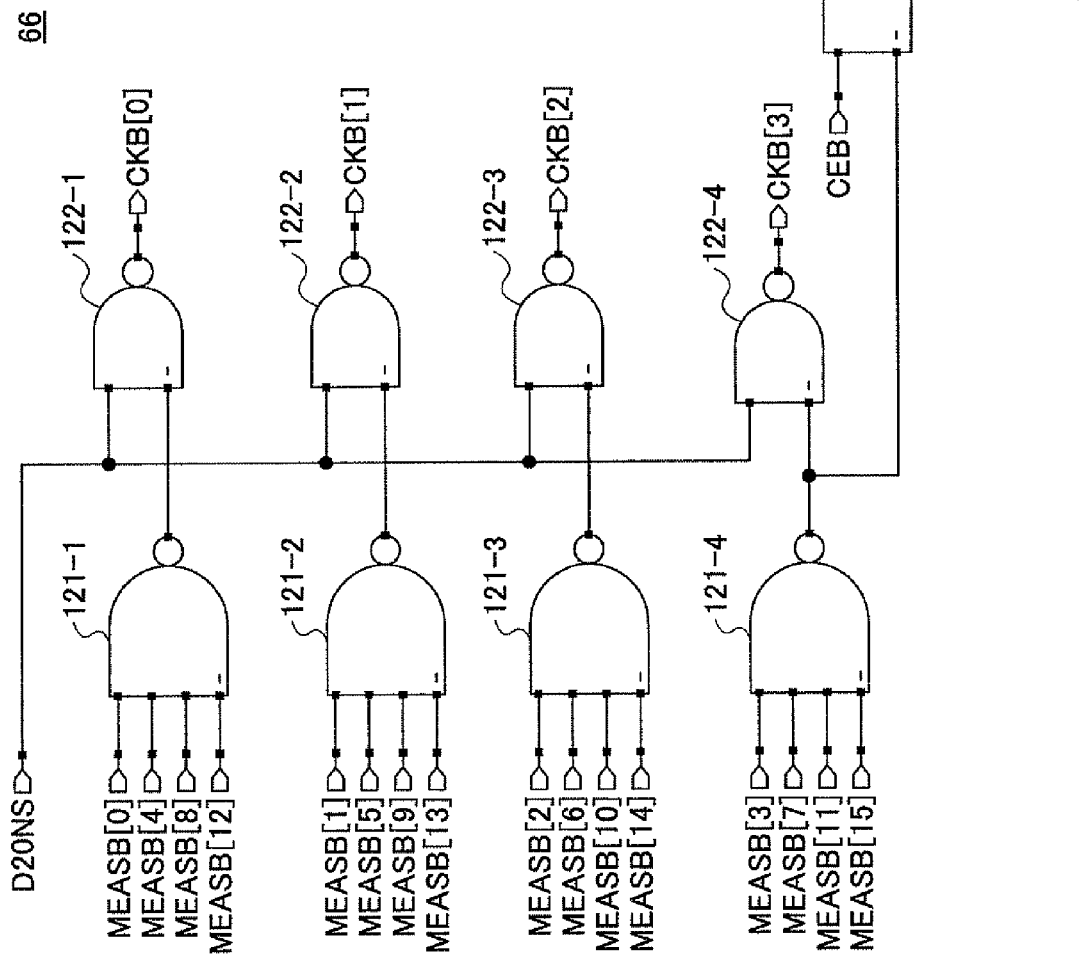
FIG. 27 is a circuit diagram illustrating an example of a sectioning unit depicted in FIG. 26.

FIG. 27 is a circuit diagram illustrating an example of the sectioning unit 66 depicted in FIG. 26. The sectioning unit 66 illustrated in FIG. 27 includes NAND gates 121-1 through 121-4, NAND gates 122-1 through 122-4, a NAND gate 123, a NOR gate 124, and a NOR gate 125. The signal D20NS, which is input into the sectioning unit 66, is generated by delaying the chip enable signal CEB by 20 nanoseconds, as previously described. Further, a signal D10NS which is also input into the sectioning unit 66 is generated by delaying the chip enable signal CEB by 10 nanoseconds.

Figure 28A:
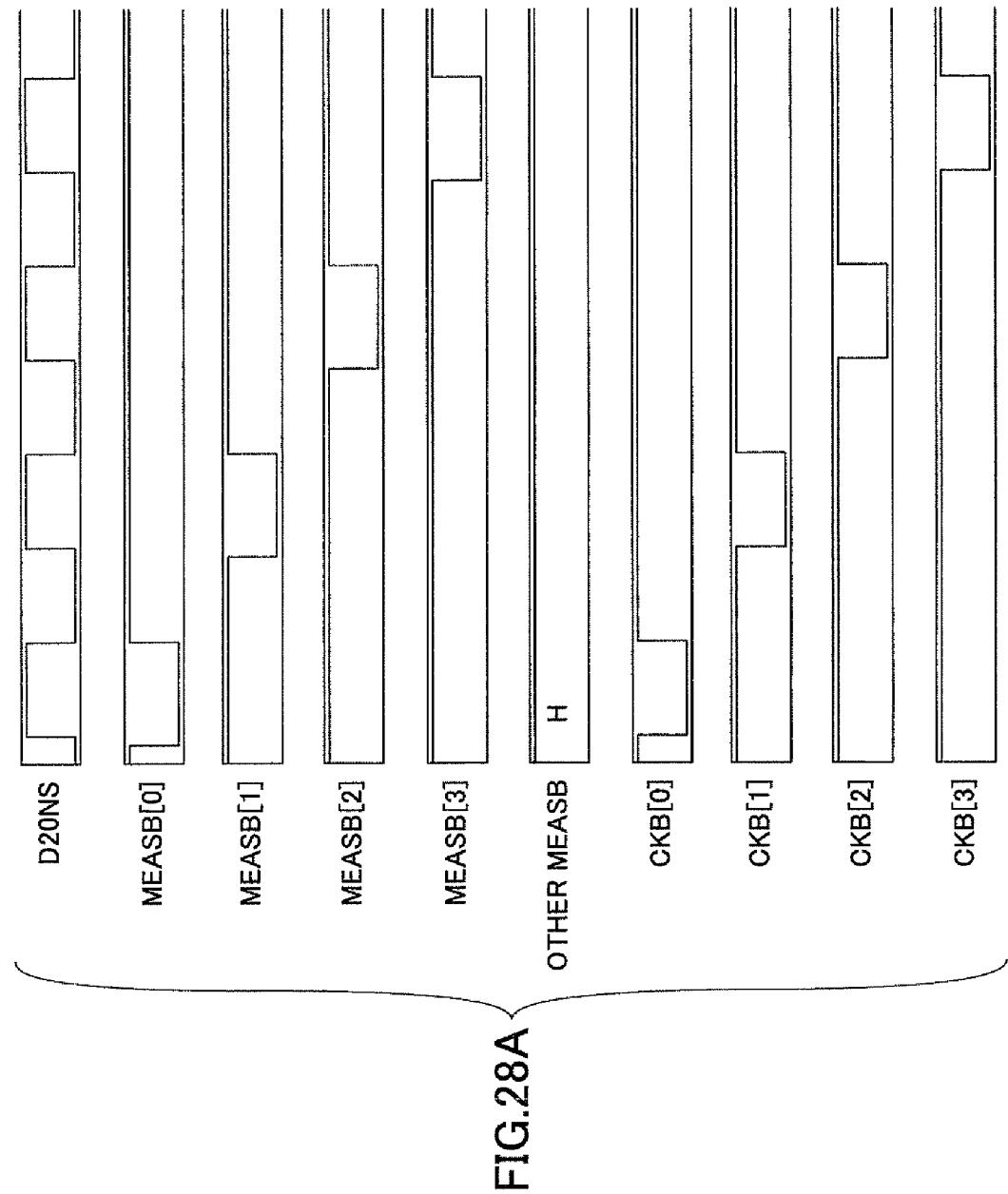
Figure 28C:
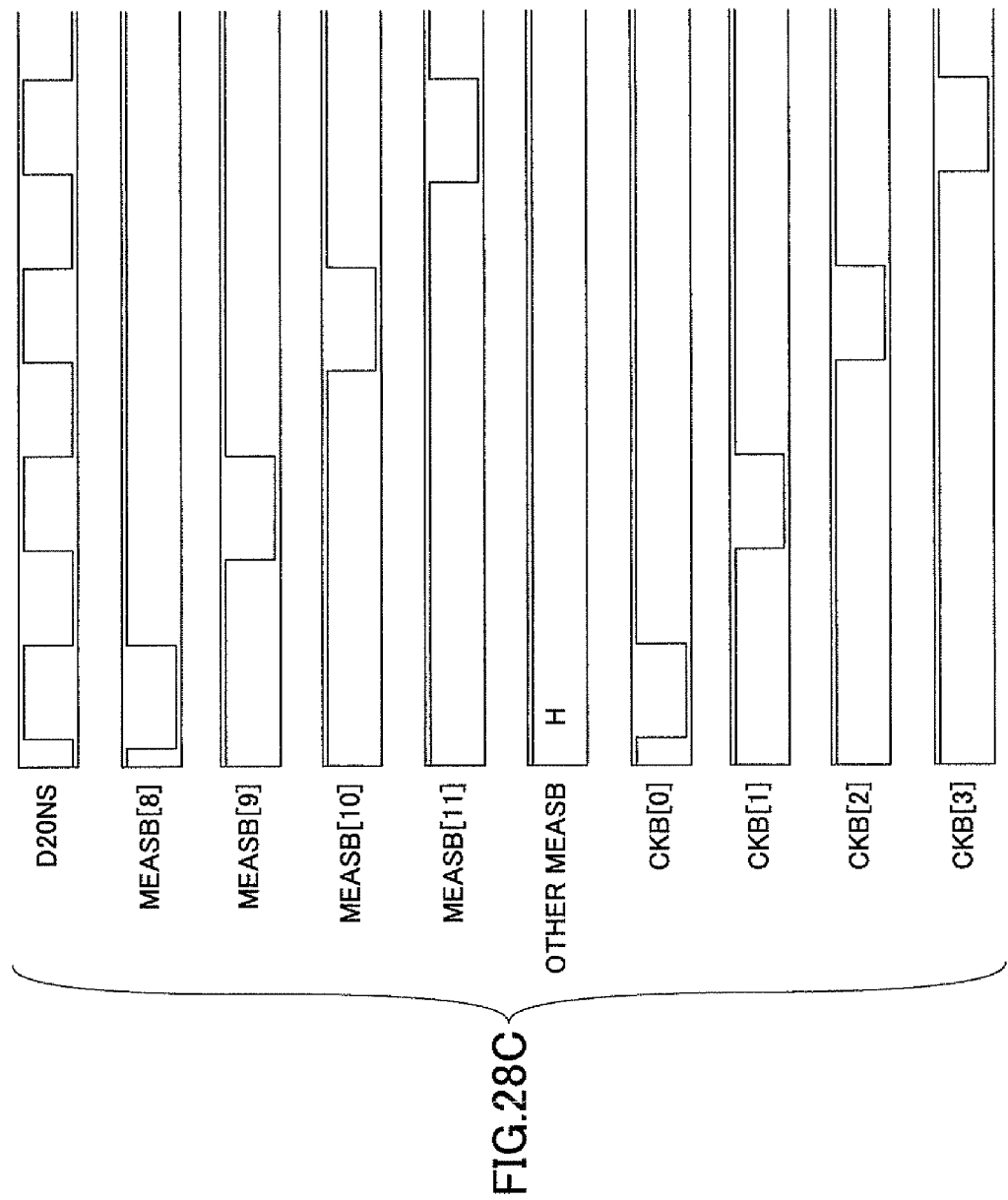
Figure 28D:
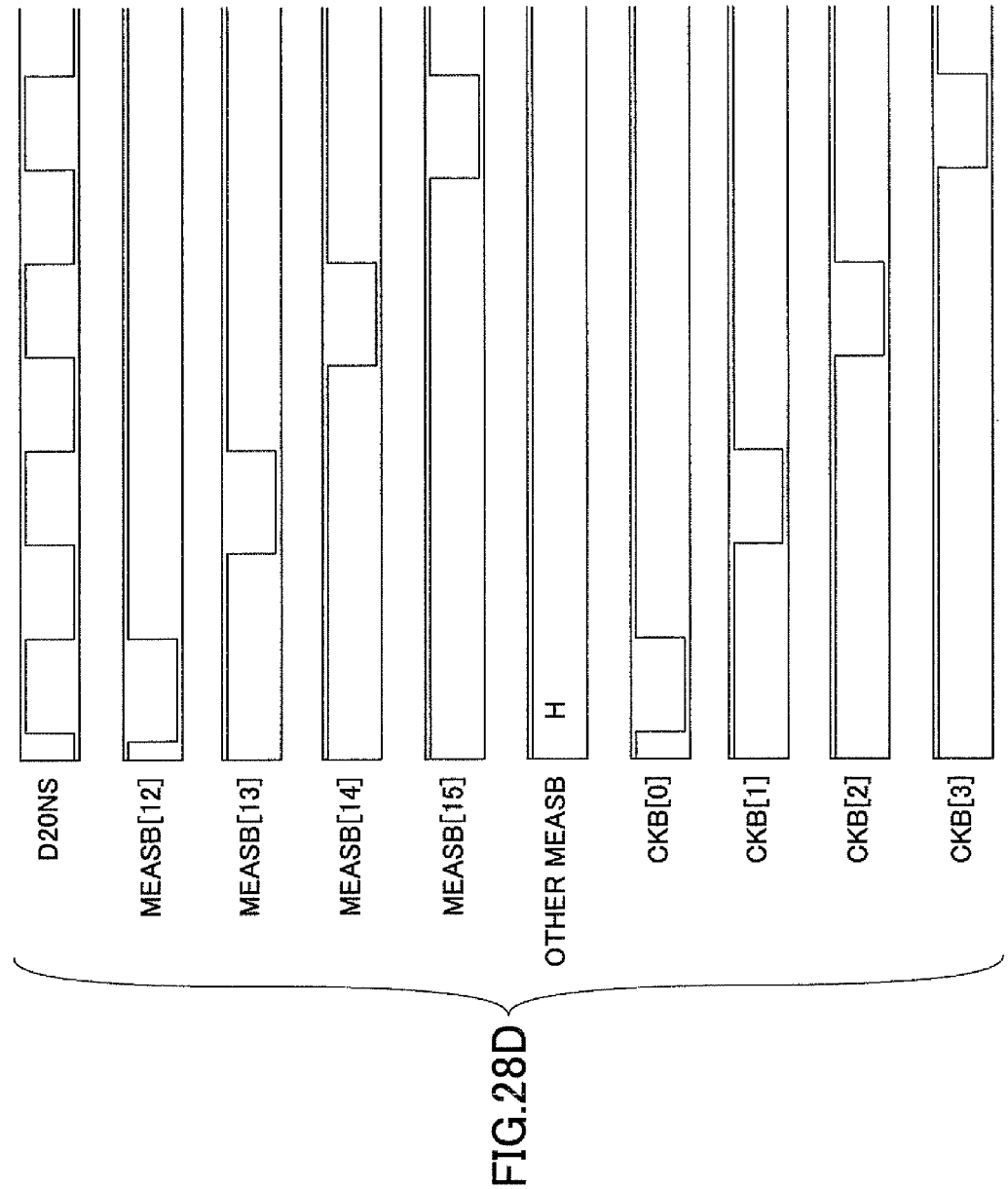

FIGS. 28A through 28D are drawings showing signal waveforms that illustrate the operation of the sectioning unit 66 depicted in FIG. 27. FIG. 28A illustrates a first section corresponding to the first cycle to the fourth cycle in which MEASB[0] through MEASB[3] (see FIG. 17C) successively exhibit LOW pulses. FIG. 28B illustrates a second section corresponding to the fifth cycle to the eighth cycle in which MEASB[4] through MEASB[7] (see FIG. 17C) successively exhibit LOW pulses. FIG. 28C illustrates a third section corresponding to the ninth cycle to the twelfth cycle in which MEASB[8] through MEASB[11] (see FIG. 17D) successively exhibit LOW pulses. FIG. 28D illustrates a fourth section corresponding to the thirteenth cycle to the sixteenth cycle in which MEASB[12] through MEASB[15] (see FIG. 17D) successively exhibit LOW pulses. As illustrated in FIGS. 28A through 28D, signals CKB[0] through CKB[3] each successively exhibit one LOW pulse in each of the first through fourth sections.

FIG. 29 is a drawing showing signal waveforms that further illustrate the operation of the sectioning unit 66 depicted in FIG. 27. As shown in FIG. 29, a signal DCKB exhibits LOW pulses at an end of the fourth cycle corresponding to the LOW pulse of MEASB[3], at an end of the eighth cycle corresponding to the LOW pulse of MEASB[7], at an end of the twelfth cycle corresponding to the LOW pulse of MEASB[11], and at an end of the sixteenth cycle corresponding to the LOW pulse of MEASB[15]. A signal CLRB1 exhibits LOW pulses substantially at the same timing as the LOW pulses of the signal DCKB. It should be noted that the LOW pulses of the signal CLRB1 are shorter than the LOW pulses of the signal DCKB. Further, the signal CLRB1 is set to LOW when the store diagnostic test signal SDTB is HIGH.

Figure 30A:
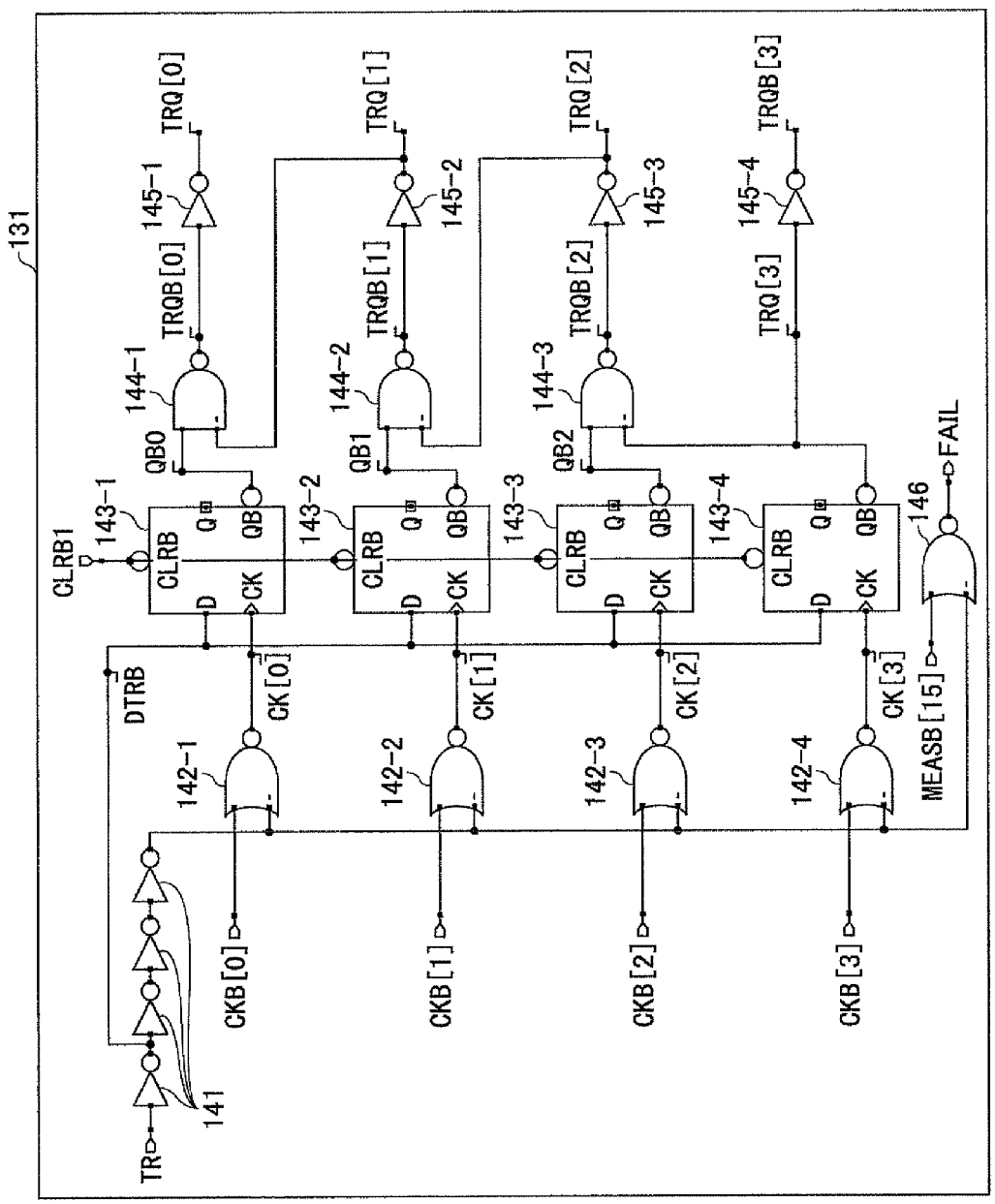
FIGS. 30A and 30B are circuit diagrams illustrating an example of the configuration of a binary code generator shown in FIG. 26.
Figure 30B:
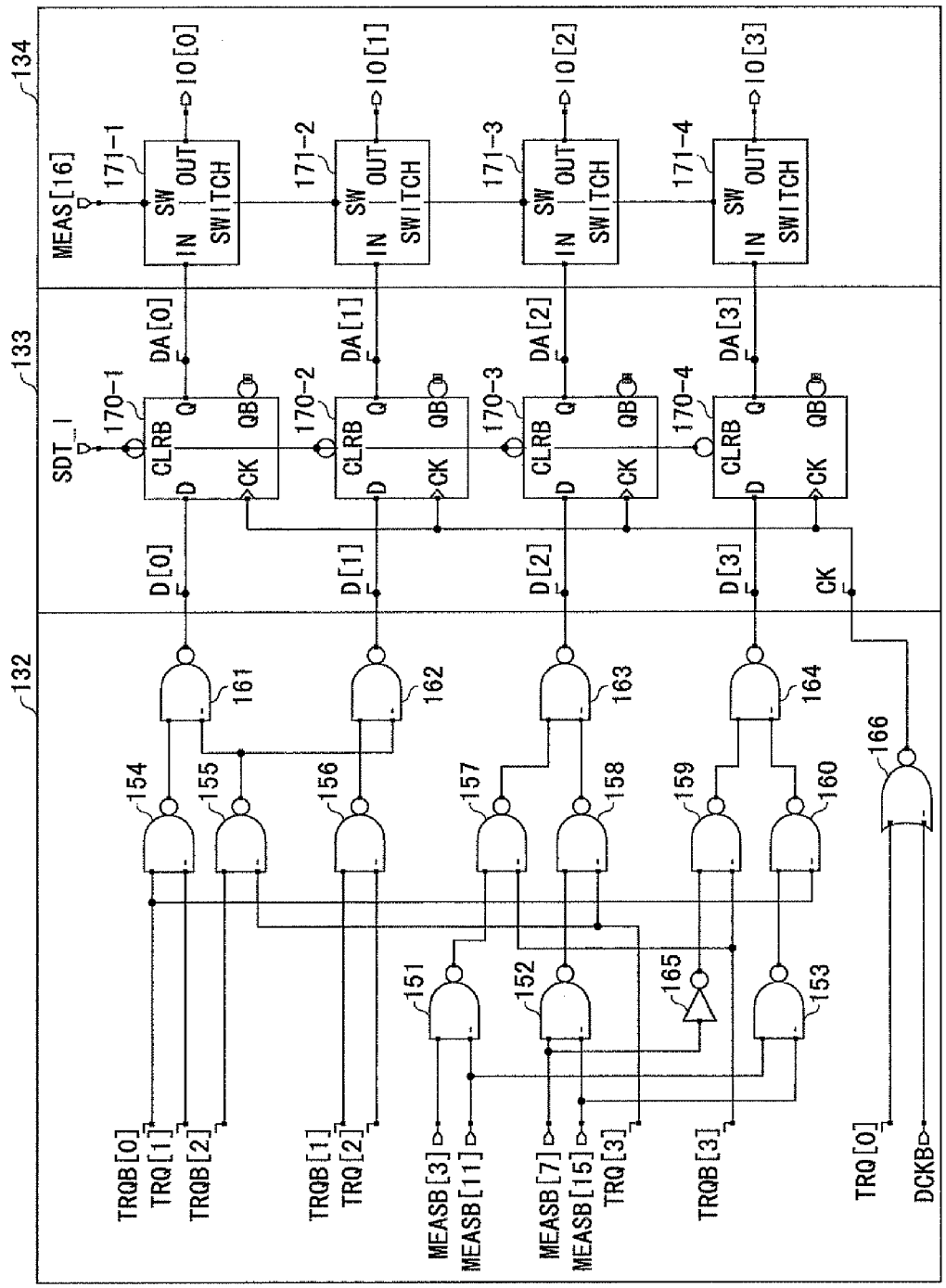

FIGS. 30A and 30B are circuit diagrams illustrating an example of the configuration of the binary code generator 65A-1 or 65A-2 shown in FIG. 26. The binary code generators 65A-1 and 65A-2 have an identical configuration illustrated in FIGS. 30A and 30B. The binary code generator includes a first circuit unit 131 illustrated in FIG. 30A, and a second circuit unit 132, a third circuit unit 133, and a fourth circuit unit 134 illustrated in FIG. 30B. The first circuit unit 131 includes a plurality of inverters 141, NOR gates 142-1 through 142-4, flip-flops 143-1 through 143-4, NAND gates 144-1 through 144-3, inverters 145-1 through 145-4, and a NOR gate 146. The second circuit unit 132 includes NAND gates 151 through 164, an inverter 165, and a NOR gate 166. The third circuit unit 133 includes flip-flops 170-1 through 170-4. The fourth circuit unit 134 includes switch circuits 171-1 through 171-4. Each of the flip-flops 143-1 through 143-4 and the flip-flops 170-1 through 170-4 may have the configuration illustrated in FIG. 14. Each of the switch circuits 171-1 through 171-4 may have the configuration illustrated in FIG. 22.

Figure 31:
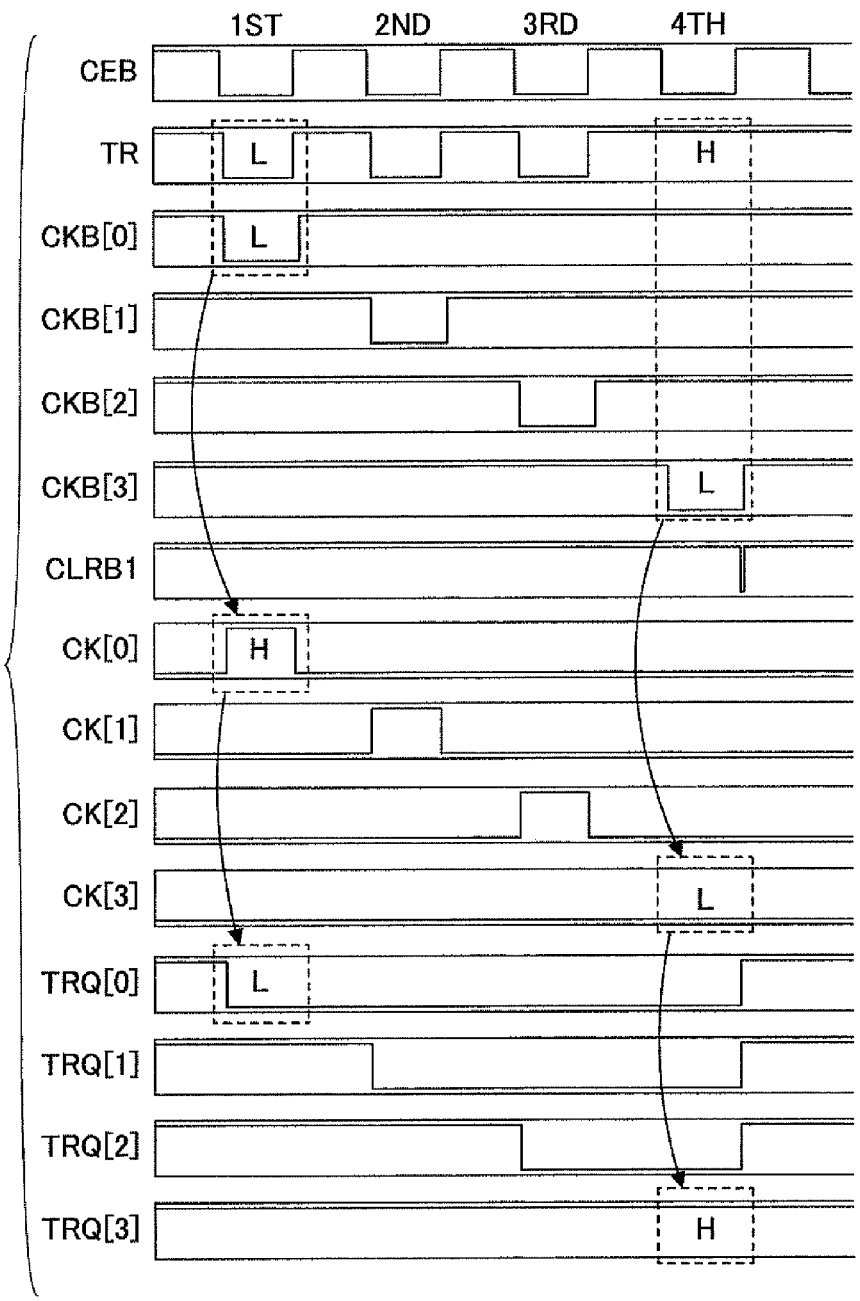
FIG. 31 is a drawing showing signal waveforms that illustrate the operation of a first circuit unit 31 depicted in FIG. 30A.

FIG. 31 is a drawing showing signal waveforms that illustrate the operation of the first circuit unit 131 depicted in FIG. 30A. The four cycles illustrated in FIG. 4 corresponds to any given one of the first through fourth sections previously described. In these four cycles, the signals CKB[0] through CKB[3] each successively exhibit one LOW pulse. When the test result TR is LOW at such a LOW pulse timing, a corresponding one of CK[0] through CK[3] input into the clock node of the respective flip-flops 143-1 through 143-4 becomes HIGH. This causes a corresponding one of TRQ[0] through TRQ[3] to be changed to LOW. Such an example is shown in the first cycle illustrated in FIG. 31. When the test result TR is HIGH at the above-noted LOW pulse timing, on the other hand, a corresponding one of CK[0] through CK[3] stays LOW. As a result, a corresponding one of TRQ[0] through TRQ[3] stays HIGH. Such an example is shown in the fourth cycle illustrated in FIG. 31.

Referring to FIG. 30A again, the circuit portion comprised of the NAND gates 144-1 through 144-3 and the inverters 145-1 through 145-4 serves to cope with the situation as illustrated in FIG. 25. This circuit portion of the first circuit unit 131 causes a LOW level appearing at TRQ[x] (x=1, 2, or 3) to propagate to TRQ[x−1]. Namely, a LOW level appearing at TRQ[x] causes TRQ[x−1] to be changed to LOW. This propagates all the way to TRQ[0]. This arrangement ensures that one or more 1s (i.e., bit value "1") appearing in the resultant bit sequence TRQ[0], TRQ[1], TRQ[2], and TRQ[3] are always consecutive and fill to the rightmost bit.

FIG. 32 is a table showing possible bit patterns TRQ[3:0] (i.e., TRQ[0], TRQ[1], TRQ[2], and TRQ[3]). As shown in FIG. 32, TRQ[3:0] is either "1111", "0111", "0011", "0001", or "0000" for any one of the first through fourth sections. As can be seen in these bit patterns, one or more 1s are always consecutive and fill to the rightmost bit.

FIG. 32 also shows D[3:0] corresponding to D[3:0] where D[3:0] (i.e., D[0], D[1], D[2], and D[3]) is obtained by the second circuit unit 132 illustrated in FIG. 30B. The second circuit unit 132 serves as an encoder to convert a bit pattern of TRQ[3:0] into a bit pattern of D[3:0] by taking into account what section is being processed at present. For example, the bit pattern "1111" obtained as TRQ[3:0] is converted into "0000" in the first section, into "0100" in the second section, into "1000" in the third section, and into "1100" in the fourth section.

Figure 33:
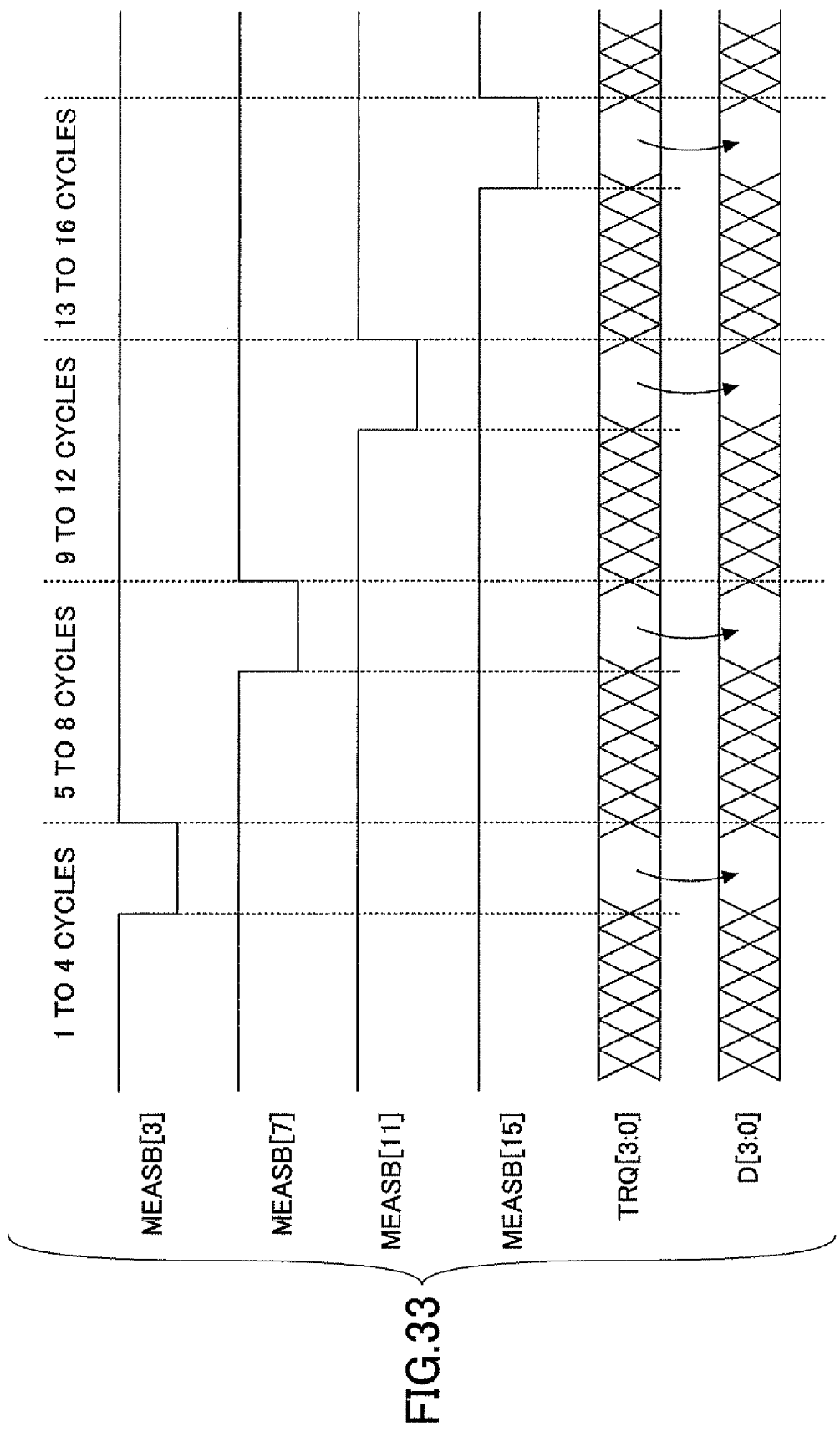
FIG. 33 is a drawing showing signal waveforms that illustrate the operation of a second circuit unit depicted in FIG. 30B.

FIG. 33 is a drawing showing signal waveforms that illustrate the operation of the second circuit unit 132 depicted in FIG. 30B. As shown in FIG. 33, the second circuit unit 132 produces valid D[3:0] in the fourth cycle in response to the LOW pulse of MEASB[3], in the eighth cycle in response to the LOW pulse of MEASB[7], in the twelfth cycle in response to the LOW pulse of MEASB[11], and in the sixteenth cycle in response to the LOW pulse of MEASB[15]. The relationships between D[3:0] and TQR[3:0] have been described above with reference to FIG. 32.

Figure 34:
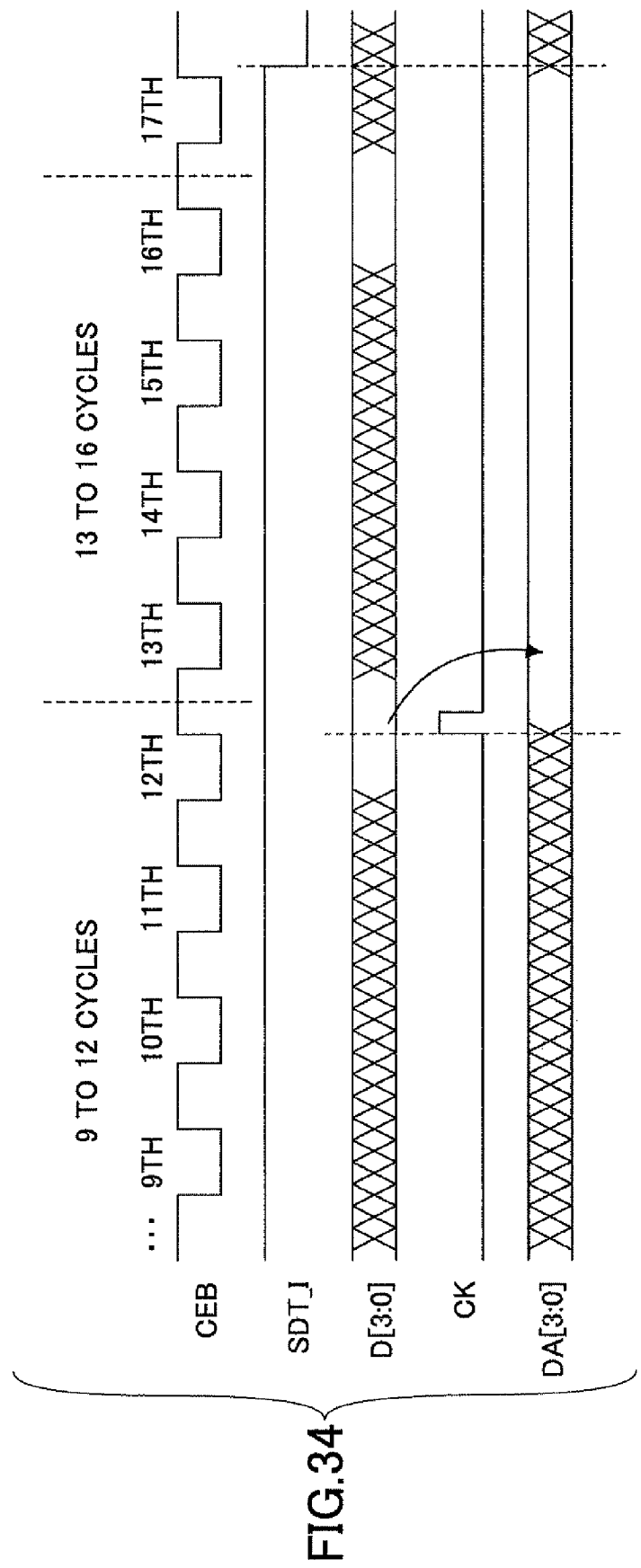
FIG. 34 is a drawing showing signal waveforms that illustrate an example of the operation of a third circuit unit depicted in FIG. 30B.

FIG. 34 is a drawing showing signal waveforms that illustrate an example of the operation of the third circuit unit 133 depicted in FIG. 30B. In the third circuit unit 133 shown in FIG. 30B, the flip-flops 170-1 through 170-4 load D[3:0] in response to a signal CK that is produced by the NOR gate 166 of the second circuit unit 132. The signal CK is asserted to HIGH at the timing indicated by DCKB (see FIG. 29) when TRQ[0] is LOW (i.e., "0"). When TRQ[0] is not LOW, the signal CK stays LOW. In the example illustrated in FIG. 34, the signal CK is asserted to HIGH at the end of the twelfth cycle, thereby causing D[3:0] to be loaded into the flip-flops as DA[3:0]. At the end of the sixteenth cycle, the signal CK is not asserted, so that DA[3:0] stored in the flip-flops at the end of the twelfth cycle remains as it is. With such an arrangement, DA[3:0] remaining in the flip-flops 170-1 through 170-4 in the end is the latest D[3:0] that has "0" in a corresponding TRQ[0] (see FIG. 32).

Figure 35:
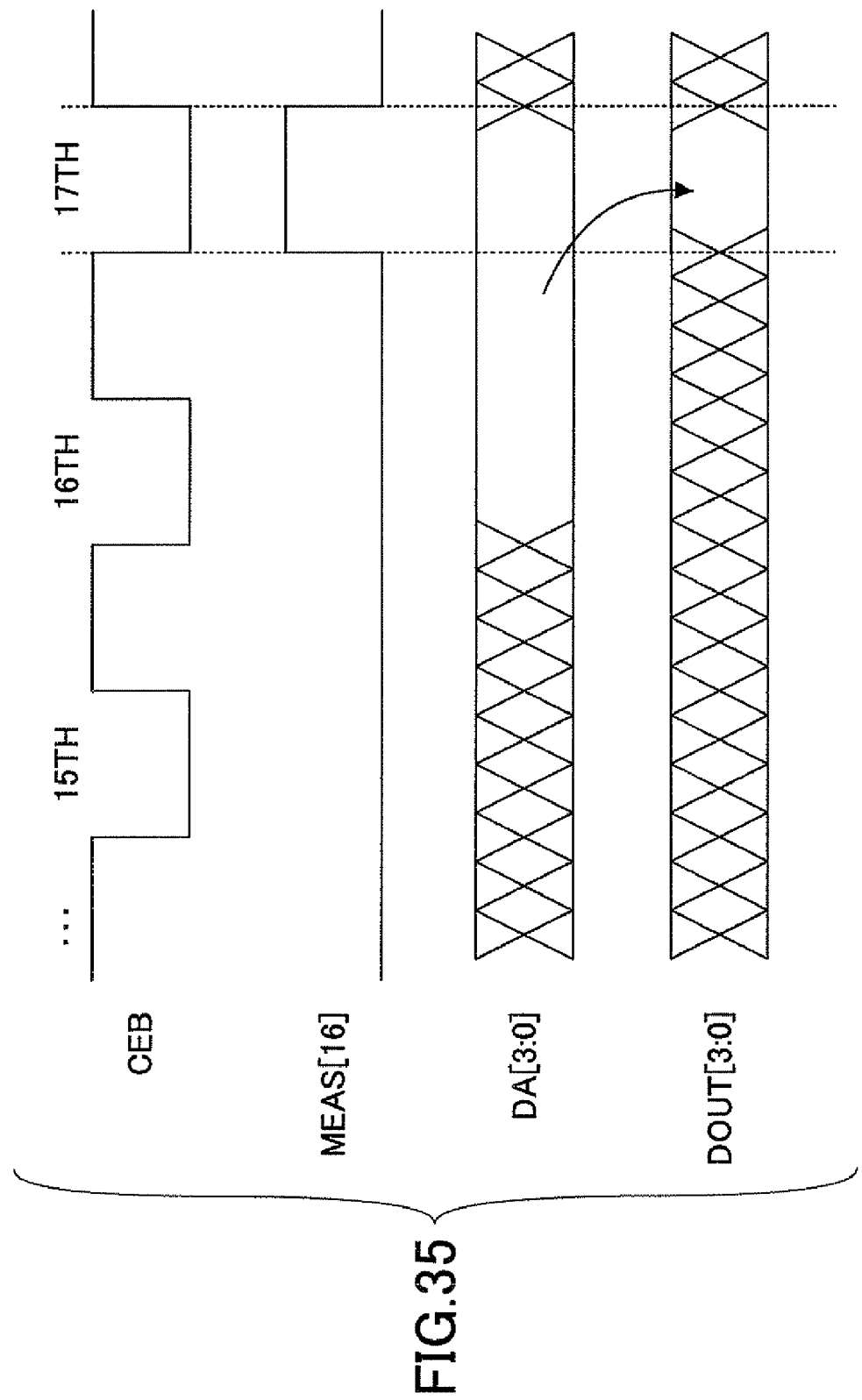
FIG. 35 is a drawing showing signal waveforms that illustrate an example of the operation of a fourth circuit unit depicted in FIG. 30B.

FIG. 35 is a drawing showing signal waveforms that illustrate an example of the operation of the fourth circuit unit 134 depicted in FIG. 30B. As shown in FIG. 30B, the switch circuits 171-1 through 171-4 allow the passage of data in response to MEAS[16]. The switch circuits 171-1 through 171-4 receive DA[3:0] as their inputs, and output data that is identical to the received data DA[3:0]. This output data is shown as DOUT[3:0] in FIG. 35. As illustrated in FIG. 35, DOUT[3:0] is output in response to the HIGH pulse of MEAS[16].

Figure 36A:
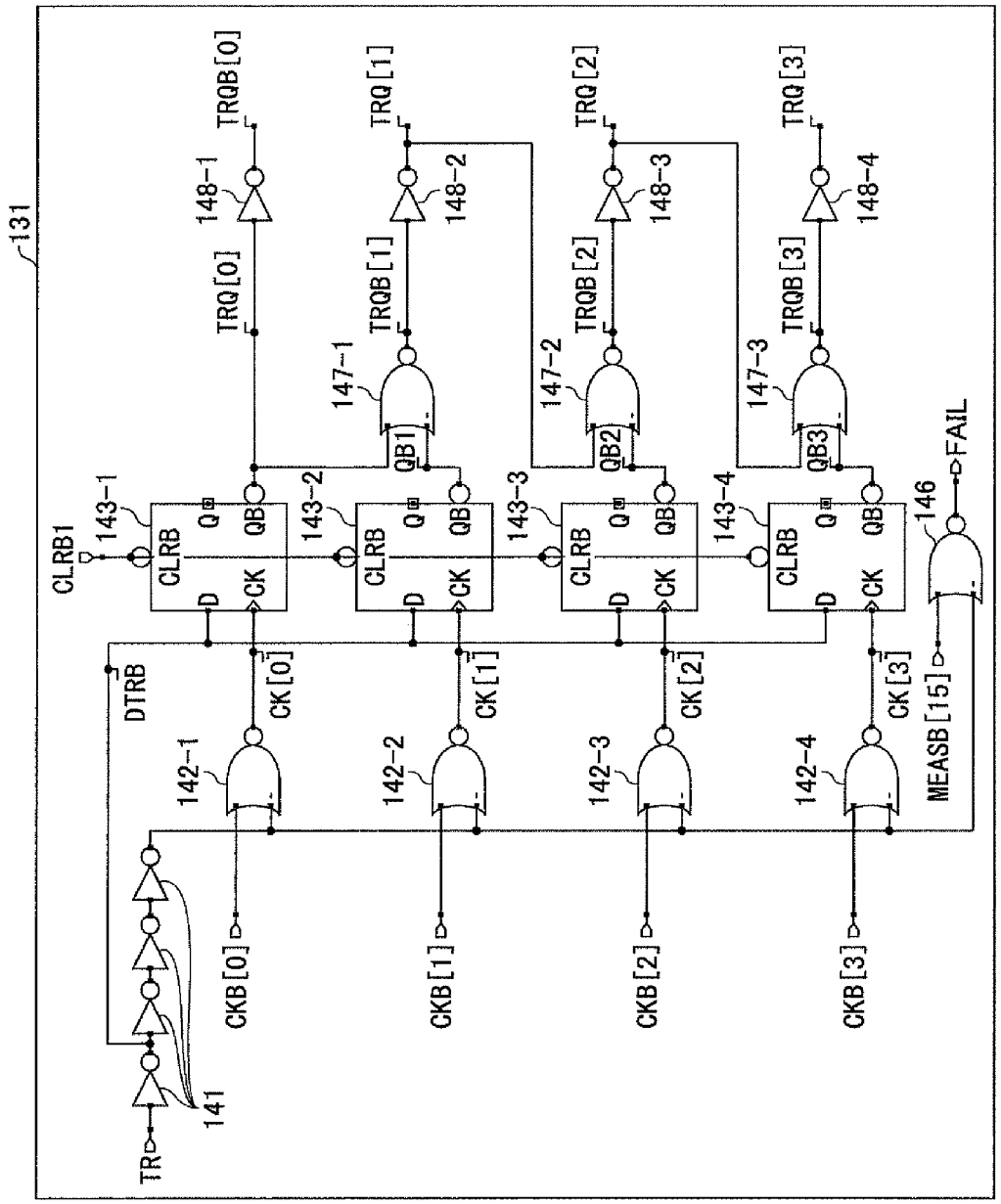
FIGS. 36A and 36B are circuit diagrams illustrating another example of the configuration of the binary code generator shown in FIG. 26.
Figure 36B:
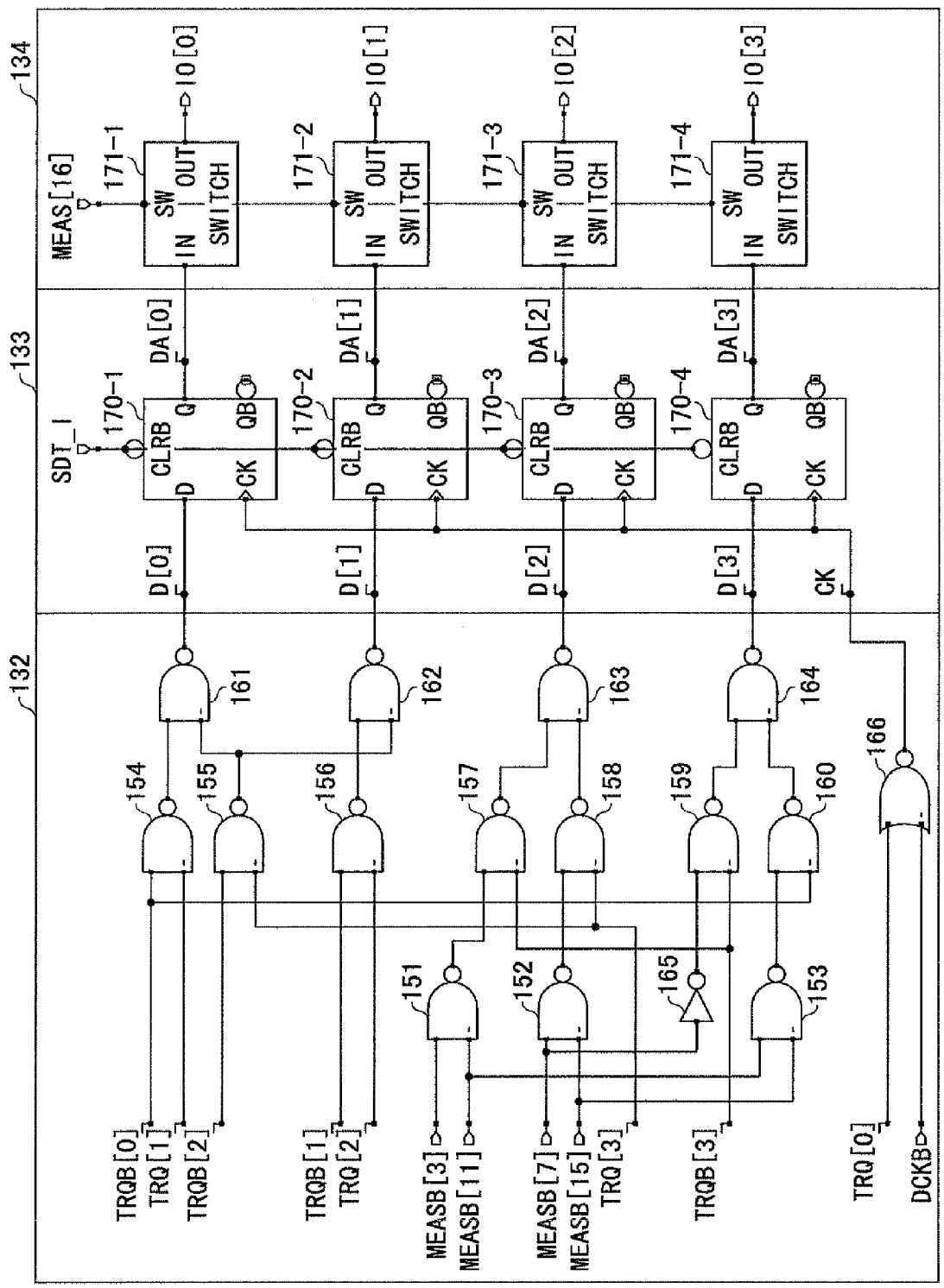

FIGS. 36A and 36B are circuit diagrams illustrating another example of the configuration of the binary code generator 65A-1 or 65A-2 shown in FIG. 26. In FIGS. 36A and 36B, the same elements as those of FIGS. 30A and 30B are referred to by the same numerals, and a description thereof will be omitted. The binary code generator of FIGS. 36A and 36B differs from the binary code generator of FIGS. 30A and 30B in that NOR gates 147-1 through 147-3 and inverters 148-1 through 148-4 are provided in place of the NAND gates 144-1 through 144-3 and the inverters 145-1 through 145-4. The circuit portion comprised of the NOR gates 147-1 through 147-3 and the inverters 148-1 through 148-4 serves to cope with the situation as illustrated in FIG. 25. This circuit portion of the first circuit unit 131 causes a HIGH level appearing at TRQ[x] (x=0, 1, or 2) to propagate to TRQ[x+1]. Namely, a HIGH level appearing at TRQ[x] causes TRQ[x+

1] to be changed to HIGH. This propagates all the way to TRQ[3]. This arrangement ensures that one or more is (i.e., bit value "1") appearing in the resultant bit sequence TRQ[0], TRQ[1], TRQ[2], and TRQ[3] are always consecutive and fill to the rightmost bit. Such a resultant bit sequence is illustrated in FIG. 32 as previously described.

With the binary code generator shown in FIG. 30A, a LOW level appearing at TRQ[x] causes TRQ[x−1] to be changed to LOW, which propagates all the way to TRQ[0]. This arrangement means that the four-bit test result data DOUT[3:0] and DOUT[7:4] indicate a reference current amount that is the largest to fall below (i.e., be smaller than) the test current $I_{BL}$. With the binary code generator shown in FIG. 36A, a HIGH level appearing at TRQ[x] causes TRQ[x+1] to be changed to HIGH, which propagates all the way to TRQ[3]. This arrangement means that the four-bit test result data DOUT[3:0] and DOUT[7:4] indicate a reference current amount that is the smallest to exceed the test current $I_{BL}$.

Further, these embodiments have been described with reference to an example in which a cell transistor to be tested is a MIS transistor that is subjected to a hot-carrier effect for storage of data. The present invention is not limited to such an example, and is applicable to any memory device in which memory cell transistors are used to store data bits. Such a memory device is not limited to a nonvolatile memory device, and may be a volatile memory device. The cell test circuitry disclosed heretofore may be used to test the memory cell transistors embedded in such a memory device. Further, memory cell transistors to be tested are not limited to N-channel transistors, and may be P-channel transistors. Those skilled in the art would easily recognize that the testing of P-channel transistors can be performed basically in the same manner as in the case of the testing of N-channel transistors. Modification to be made to the test cell circuitry disclosed heretofore for the purpose of testing P-channel transistors requires only a routine skill in the art.

Moreover, the embodiments described heretofore have been directed to an example in which a reference current is successively increased. This is not intended to be limiting in any manner. The reference current may be successively decreased, and the first current to go below a test current may be used to indicate the amount of test current.

Further, the present invention is not limited to these embodiments, but various variations and modifications may be made without departing from the scope of the present invention.

What is claimed is:

1. A semiconductor memory device, comprising:
a plurality of memory cell transistors arranged in a matrix and each configured to store data; and
a test circuit configured to output to outside the semiconductor memory device an output signal indicative of an amount of test current flowing through a selected one of the plurality of memory cell transistors,
wherein the test circuit includes:
a plurality of reference cell transistors employed to successively produce varying amounts of currents;
a comparison circuit configured to successively compare the amount of test current with each of the varying amounts of currents; and
a code generating circuit configured to generate a code indicative of a result of the successive comparisons performed by the comparison circuit, wherein the code is output as the output signal, wherein one of the varying amounts of currents is a maximum tolerable current amount that is allowed to flow through any one of the memory cell transistors.

2. A semiconductor memory device, comprising:
a plurality of memory cell transistors arranged in a matrix and each configured to store data; and
a test circuit configured to output to outside the semiconductor memory device an output signal indicative of an amount of test current flowing through a selected one of the plurality of memory cell transistors,
wherein the test circuit includes:
a plurality of reference cell transistors employed to successively produce varying amounts of currents;
a comparison circuit configured to successively compare the amount of test current with each of the varying amounts of currents; and
a code generating circuit configured to generate a code indicative of a result of the successive comparisons performed by the comparison circuit, wherein the code is output as the output signal, wherein the code generating circuit is configured to generate the code such that the code has a value indicative of one of the varying amounts of currents that is detected as a smallest to exceed the amount of test current.

3. A semiconductor memory device, comprising:
a plurality of memory cell transistors arranged in a matrix and each configured to store data; and
a test circuit configured to output to outside the semiconductor memory device an output signal indicative of an amount of test current flowing through a selected one of the plurality of memory cell transistors,
wherein the test circuit includes:
a plurality of reference cell transistors employed to successively produce varying amounts of currents;
a comparison circuit configured to successively compare the amount of test current with each of the varying amounts of currents; and
a code generating circuit configured to generate a code indicative of a result of the successive comparisons performed by the comparison circuit, wherein the code is output as the output signal, wherein the code generating circuit is configured to generate the code such that the code has a value indicative of one of the varying amounts of currents that is detected as a largest to fall below the amount of test current.

* * * * *